(12) United States Patent
Ching et al.

(10) Patent No.: US 11,575,027 B2
(45) Date of Patent: Feb. 7, 2023

(54) DUMMY DIELECTRIC FIN DESIGN FOR PARASITIC CAPACITANCE REDUCTION

(71) Applicant: Taiwan Semiconductor Manufacturing Co., Ltd., Hsinchu (TW)

(72) Inventors: Kuo-Cheng Ching, Zhubei (TW); Chih-Hao Wang, Baoshan Township (TW); Shi Ning Ju, Hsinchu (TW); Kuan-Lun Cheng, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 8 days.

(21) Appl. No.: 17/222,608

(22) Filed: Apr. 5, 2021

(65) Prior Publication Data
US 2021/0226037 A1   Jul. 22, 2021

Related U.S. Application Data

(62) Division of application No. 16/448,704, filed on Jun. 21, 2019, now Pat. No. 10,971,605.
(Continued)

(51) Int. Cl.
*H01L 29/66* (2006.01)
*H01L 27/092* (2006.01)
(Continued)

(52) U.S. Cl.
CPC ...... *H01L 29/6681* (2013.01); *H01L 27/0924* (2013.01); *H01L 29/41791* (2013.01);
(Continued)

(58) Field of Classification Search
CPC ..... H01L 21/823431; H01L 21/823821; H01L 21/845; H01L 29/66795–66818; H01L 29/41791; H01L 29/785–786; H01L 2029/7857–7858; H01L 27/0886; H01L 27/0924; H01L 27/10826; H01L 27/10879; H01L 27/1211; H01L 21/76; H01L 21/762; H01L 21/823481; H01L 29/0603;
(Continued)

(56) References Cited

U.S. PATENT DOCUMENTS 7,425,740 B2   9/2008   Liu et al.
7,667,271 B2   2/2010   Yu et al.
(Continued)

*Primary Examiner* — Sonya McCall-Shepard
(74) *Attorney, Agent, or Firm* — Haynes and Boone, LLP

(57) ABSTRACT

A semiconductor device includes a first device fin and a second device fin. A first source/drain component is epitaxially grown over the first device fin. A second source/drain component is epitaxially grown over the second device fin. A first dummy fin structure is disposed between the first device fin and the second device fin. A gate structure partially wraps around the first device fin, the second device fin, and the first dummy fin structure. A first portion of the first dummy fin structure is disposed between the first source/drain component and the second source/drain component and outside the gate structure. A second portion of the first dummy fin structure is disposed underneath the gate structure. The first portion of the first dummy fin structure and the second portion of the first dummy fin structure have different physical characteristics.

20 Claims, 19 Drawing Sheets

Related U.S. Application Data

(60) Provisional application No. 62/748,617, filed on Oct. 22, 2018.

(51) Int. Cl.

| | | |
|---|---|---|
| *H01L 29/417* | (2006.01) | |
| *H01L 29/51* | (2006.01) | |
| *H01L 29/78* | (2006.01) | |
| *H01L 21/8234* | (2006.01) | |
| *H01L 27/088* | (2006.01) | |
| *H01L 21/8238* | (2006.01) | |
| *H01L 29/06* | (2006.01) | |
| *H01L 29/08* | (2006.01) | |

(52) U.S. Cl.
CPC ...... *H01L 29/511* (2013.01); *H01L 29/66545* (2013.01); *H01L 29/785* (2013.01); *H01L 29/7855* (2013.01)

(58) Field of Classification Search
CPC ... H01L 29/0847; H01L 29/51; H01L 29/511; H01L 21/76224–76237; H01L 21/823878; H01L 23/5329–53295; H01L 21/76801–76837; H01L 29/6681; H01L 29/0642; H01L 29/0649; H01L 29/0653; H01L 21/31–31138; H01L 29/6881
See application file for complete search history.

(56) References Cited

U.S. PATENT DOCUMENTS

| | | | |
|---|---|---|---|
| 7,910,453 B2 | 3/2011 | Xu et al. | |
| 8,048,723 B2 | 11/2011 | Chang et al. | |
| 8,053,299 B2 | 11/2011 | Xu | |
| 8,183,627 B2 | 5/2012 | Currie | |
| 8,362,575 B2 | 1/2013 | Kwok et al. | |
| 8,367,498 B2 | 2/2013 | Chang et al. | |
| 8,377,779 B1 | 2/2013 | Wang | |
| 8,399,931 B2 | 3/2013 | Liaw et al. | |
| 8,415,718 B2 | 4/2013 | Xu | |
| 8,440,517 B2 | 5/2013 | Lin et al. | |
| 8,487,378 B2 | 7/2013 | Goto et al. | |
| 8,497,177 B1 | 7/2013 | Chang et al. | |
| 8,497,528 B2 | 7/2013 | Lee et al. | |
| 8,609,518 B2 | 12/2013 | Wann et al. | |
| 8,610,240 B2 | 12/2013 | Lee et al. | |
| 8,618,556 B2 | 12/2013 | Wu et al. | |
| 8,633,516 B1 | 1/2014 | Wu et al. | |
| 8,652,894 B2 | 2/2014 | Lin et al. | |
| 8,680,576 B2 | 3/2014 | Ching et al. | |
| 8,686,516 B2 | 4/2014 | Chen et al. | |
| 8,703,565 B2 | 4/2014 | Chang et al. | |
| 8,716,765 B2 | 5/2014 | Wu et al. | |
| 8,723,272 B2 | 5/2014 | Liu et al. | |
| 8,729,627 B2 | 5/2014 | Cheng et al. | |
| 8,729,634 B2 | 5/2014 | Shen et al. | |
| 8,735,993 B2 | 5/2014 | Lo et al. | |
| 8,736,056 B2 | 5/2014 | Lee et al. | |
| 8,742,509 B2 | 6/2014 | Lee et al. | |
| 8,772,109 B2 | 7/2014 | Colinge | |
| 8,776,734 B1 | 7/2014 | Roy et al. | |
| 8,785,285 B2 | 7/2014 | Tsai et al. | |
| 8,796,666 B1 | 8/2014 | Huang et al. | |
| 8,796,759 B2 | 8/2014 | Perng et al. | |
| 8,809,139 B2 | 8/2014 | Huang et al. | |
| 8,815,712 B2 | 8/2014 | Wan et al. | |
| 8,816,444 B2 | 8/2014 | Wann et al. | |
| 8,823,065 B2 | 9/2014 | Wang et al. | |
| 8,826,213 B1 | 9/2014 | Ho et al. | |
| 8,828,823 B2 | 9/2014 | Liu et al. | |
| 8,836,016 B2 | 9/2014 | Wu et al. | |
| 8,841,701 B2 | 9/2014 | Lin et al. | |
| 8,847,293 B2 | 9/2014 | Lee et al. | |
| 8,853,025 B2 | 10/2014 | Zhang et al. | |
| 8,860,148 B2 | 10/2014 | Hu et al. | |
| 8,887,106 B2 | 11/2014 | Ho et al. | |
| 2011/0068407 A1 | 3/2011 | Yeh et al. | |
| 2013/0011983 A1 | 1/2013 | Tsai et al. | |
| 2013/0285153 A1 | 10/2013 | Lee et al. | |
| 2014/0001574 A1 | 1/2014 | Chen et al. | |
| 2014/0110755 A1 | 4/2014 | Colinge | |
| 2014/0151812 A1 | 6/2014 | Liaw | |
| 2014/0183600 A1 | 7/2014 | Huang et al. | |
| 2014/0252412 A1 | 9/2014 | Tsai et al. | |
| 2014/0264590 A1 | 9/2014 | Yu et al. | |
| 2014/0264592 A1 | 9/2014 | Oxland et al. | |
| 2014/0282326 A1 | 9/2014 | Chen et al. | |
| 2015/0372140 A1 | 12/2015 | Liu et al. | |
| 2020/0091142 A1* | 3/2020 | Ching | H01L 27/0886 |
| 2020/0119001 A1 | 4/2020 | Shu et al. | |
| 2020/0127113 A1 | 4/2020 | Ching et al. | |

* cited by examiner

DUMMY DIELECTRIC FIN DESIGN FOR PARASITIC CAPACITANCE REDUCTION

PRIORITY DATA

The present application is a divisional of U.S. patent application Ser. No. 16/448,704, filed on Jun. 21, 2019, which claims priority to U.S. Provisional patent Application No. 62/748,617, filed on Oct. 22, 2018, the disclosures of which are hereby incorporated by reference in their entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

However, such scaling down has also increased the complexity of processing and manufacturing ICs and, for these advances to be realized. Similar developments in IC processing and manufacturing are needed. For example, a three-dimensional transistor, such as a fin-like field-effect transistor (FinFET), has been introduced to replace a planar transistor. A FinFET can be thought of as a typical planar device extruded into the gate. A typical FinFET is fabricated with a thin "fin" (or fin structure) extending up from a substrate. The channel of the FET is formed in this vertical fin, and a gate is provided over (e.g., wrapping around) the channel region of the fin. Wrapping the gate around the fin increases the contact area between the channel region and the gate and allows the gate to control the channel from multiple sides. This can be leveraged in a number of ways, and in some applications, FinFETs provide reduced short channel effects, reduced leakage, and higher current flow. In other words, they may be faster, smaller, and more efficient than planar devices.

Despite the advantages, existing FinFET devices may still need improvements. For example, FinFET devices may use dielectric structures to prevent the bridging of adjacent epi-layers. However, such dielectric structures for existing FinFET devices either cannot fully prevent the bridging between the adjacent epi-layers, or they may have an excessive contribution to parasitic capacitance.

Therefore, while existing FinFET devices and the fabrication thereof have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments.

DETAILED DESCRIPTION

Figure 1:
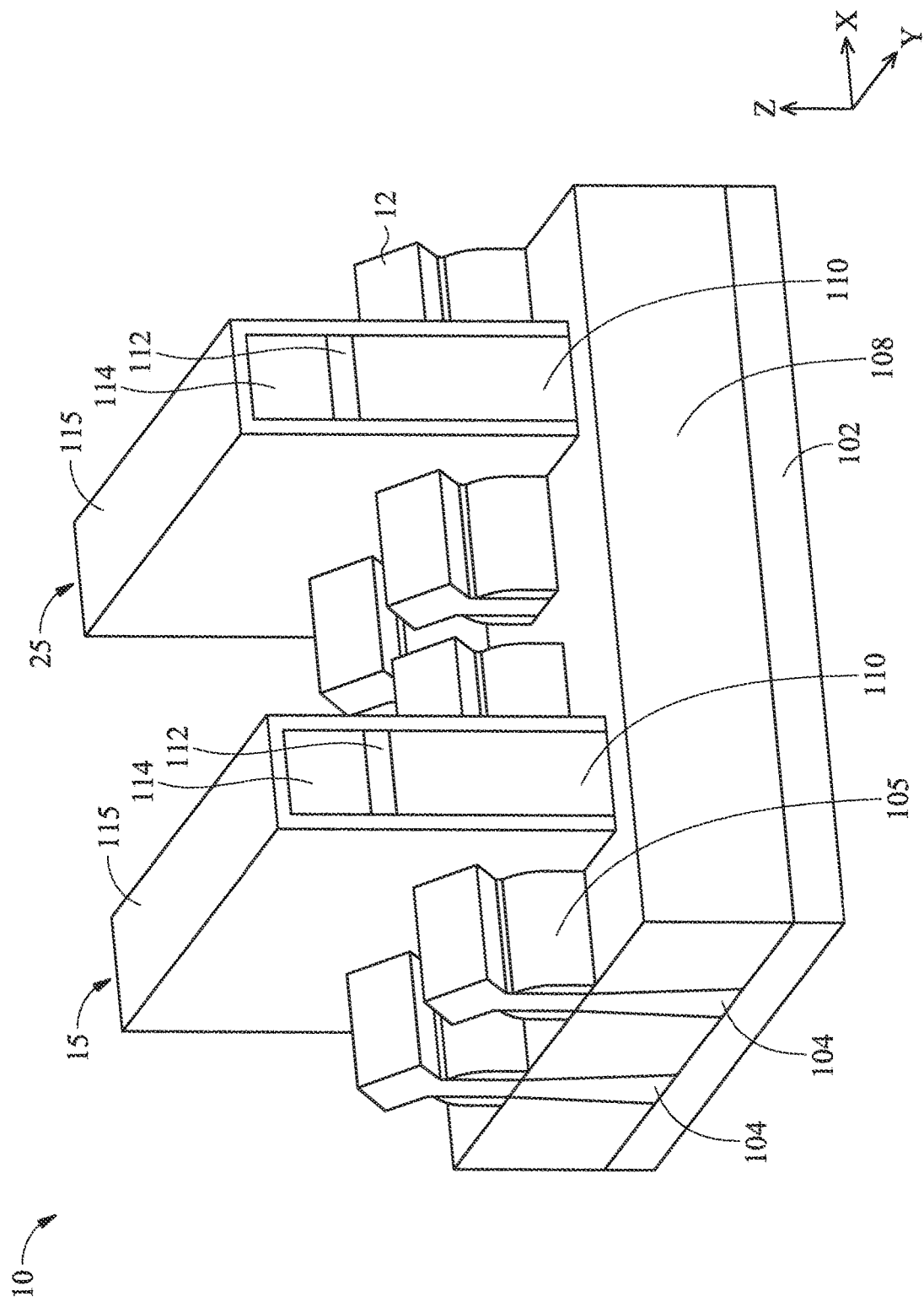
FIG. 1 is a perspective view of an example FinFET transistor.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The semiconductor industry has progressed into nanometer technology process nodes in pursuit of higher device density, higher performance, and lower costs. To realize these improvements, the use of FinFET devices has been gaining popularity in the semiconductor industry.

The present disclosure is directed to, but not otherwise limited to, a method of forming dummy dielectric fin structures in a manner order to simultaneously optimize device performance and reduce transistor bridging/shorting concerns. To illustrate the various aspects of the present disclosure, a FinFET fabrication process is discussed below as an example. In that regard, a FinFET device is a fin-like field-effect transistor device, which has been gaining popularity in the semiconductor industry. The FinFET device may be a complementary metal-oxide-semiconductor (CMOS) device including a P-type metal-oxide-semiconductor (PMOS) FinFET device and an N-type metal-oxidesemiconductor (NMOS) FinFET device. The following disclosure will continue with one or more FinFET examples to illustrate various embodiments of the present disclosure, but it is understood that the application is not limited to the FinFET device, except as specifically claimed.

Referring to FIG. 1, a perspective view of an example FinFET device 10 is illustrated. The FinFET device structure 10 includes an N-type FinFET device structure (NMOS) 15 and a P-type FinFET device structure (PMOS) 25. The FinFET device structure 10 includes a substrate 102. The substrate 102 may be made of silicon or other semiconductor materials. Alternatively or additionally, the substrate 102 may include other elementary semiconductor materials such as germanium. In some embodiments, the substrate 102 is made of a compound semiconductor such as silicon carbide, gallium arsenic, indium arsenide, or indium phosphide. In some embodiments, the substrate 102 is made of an alloy semiconductor such as silicon germanium, silicon germanium carbide, gallium arsenic phosphide, or gallium indium phosphide. In some embodiments, the substrate 102 includes an epitaxial layer. For example, the substrate 102 may include an epitaxial layer overlying a bulk semiconductor.

The FinFET device structure 10 also includes one or more fin structures 104 (e.g., Si fins) that extend from the substrate 102 in the Z-direction and surrounded by spacers 105 in the Y-direction. The fin structure 104 is elongated in the X-direction and may optionally include germanium (Ge). The fin structure 104 may be formed by using suitable processes such as photolithography and etching processes. In some embodiments, the fin structure 104 is etched from the substrate 102 using dry etch or plasma processes. In some other embodiments, the fin structure 104 can be formed by a multiple patterning lithography process, such as a double-patterning lithography (DPL) process. DPL is a method of constructing a pattern on a substrate by dividing the pattern into two interleaved patterns. DPL allows enhanced feature (e.g., fin) density. The fin structure 104 also includes an epi-grown material 12, which may (along with portions of the fin structure 104) serve as the source/drain of the FinFET device structure 10.

An isolation structure 108, such as a shallow trench isolation (STI) structure, is formed to surround the fin structure 104. In some embodiments, a lower portion of the fin structure 104 is surrounded by the isolation structure 108, and an upper portion of the fin structure 104 protrudes from the isolation structure 108, as shown in FIG. 1. In other words, a portion of the fin structure 104 is embedded in the isolation structure 108. The isolation structure 108 prevents electrical interference or crosstalk.

The FinFET device structure 10 further includes a gate stack structure including a gate electrode 110 and a gate dielectric layer (not shown) below the gate electrode 110. The gate electrode 110 may include polysilicon or metal. Metal includes tantalum nitride (TaN), nickel silicon (NiSi), cobalt silicon (CoSi), molybdenum (Mo), copper (Cu), tungsten (W), aluminum (Al), cobalt (Co), zirconium (Zr), platinum (Pt), or other applicable materials. Gate electrode 110 may be formed in a gate last process (or gate replacement process). Hard mask layers 112 and 114 may be used to define the gate electrode 110. A dielectric layer 115 may also be formed on the sidewalls of the gate electrode 110 and over the hard mask layers 112 and 114. In at least one embodiment, the dielectric layer 115 is directly in contact with the gate electrode 110.

The gate dielectric layer (not shown) may include dielectric materials, such as silicon oxide, silicon nitride, silicon oxynitride, dielectric material(s) with high dielectric constant (high-k), or combinations thereof. Examples of high-k dielectric materials include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, the like, or combinations thereof.

In some embodiments, the gate stack structure includes additional layers, such as interfacial layers, capping layers, diffusion/barrier layers, or other applicable layers. In some embodiments, the gate stack structure is formed over a central portion of the fin structure 104. In some other embodiments, multiple gate stack structures are formed over the fin structure 104. In some other embodiments, the gate stack structure includes a dummy gate stack and is replaced later by a metal gate (MG) after high thermal budget processes are performed.

The gate stack structure is formed by a deposition process, a photolithography process and an etching process. The deposition process include chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), plating, other suitable methods, and/or combinations thereof. The photolithography processes include photoresist coating (e.g., spin-on coating), soft baking, mask aligning, exposure, post-exposure baking, developing the photoresist, rinsing, drying (e.g., hard baking). The etching process includes a dry etching process or a wet etching process. Alternatively, the photolithography process is implemented or replaced by other proper methods such as maskless photolithography, electron-beam writing, and ion-beam writing.

FinFET devices offer several advantages over traditional Metal-Oxide Semiconductor Field Effect Transistor (MOSFET) devices (also referred to as planar transistor devices). These advantages may include better chip area efficiency, improved carrier mobility, and fabrication processing that is compatible with the fabrication processing of planar devices. Thus, it may be desirable to design an integrated circuit (IC) chip using FinFET devices for a portion of, or the entire IC chip.

However, there may still be areas in which conventional FinFET fabrication need improvements. For example, FinFET device fabrication may involve forming a dielectric structure such as a dummy fin structure to prevent the bridging (e.g., electrical shorting) between adjacent epi-layers, tune an overall fin pattern density, reinforce the mechanical strength of the device fins, and/or enhance the manufacturing capability. However, existing FinFET fabrication processes may result in dummy fins that contribute excessively to parasitic capacitance, which degrades device performance, particularly for high frequency applications.

Figure 17:
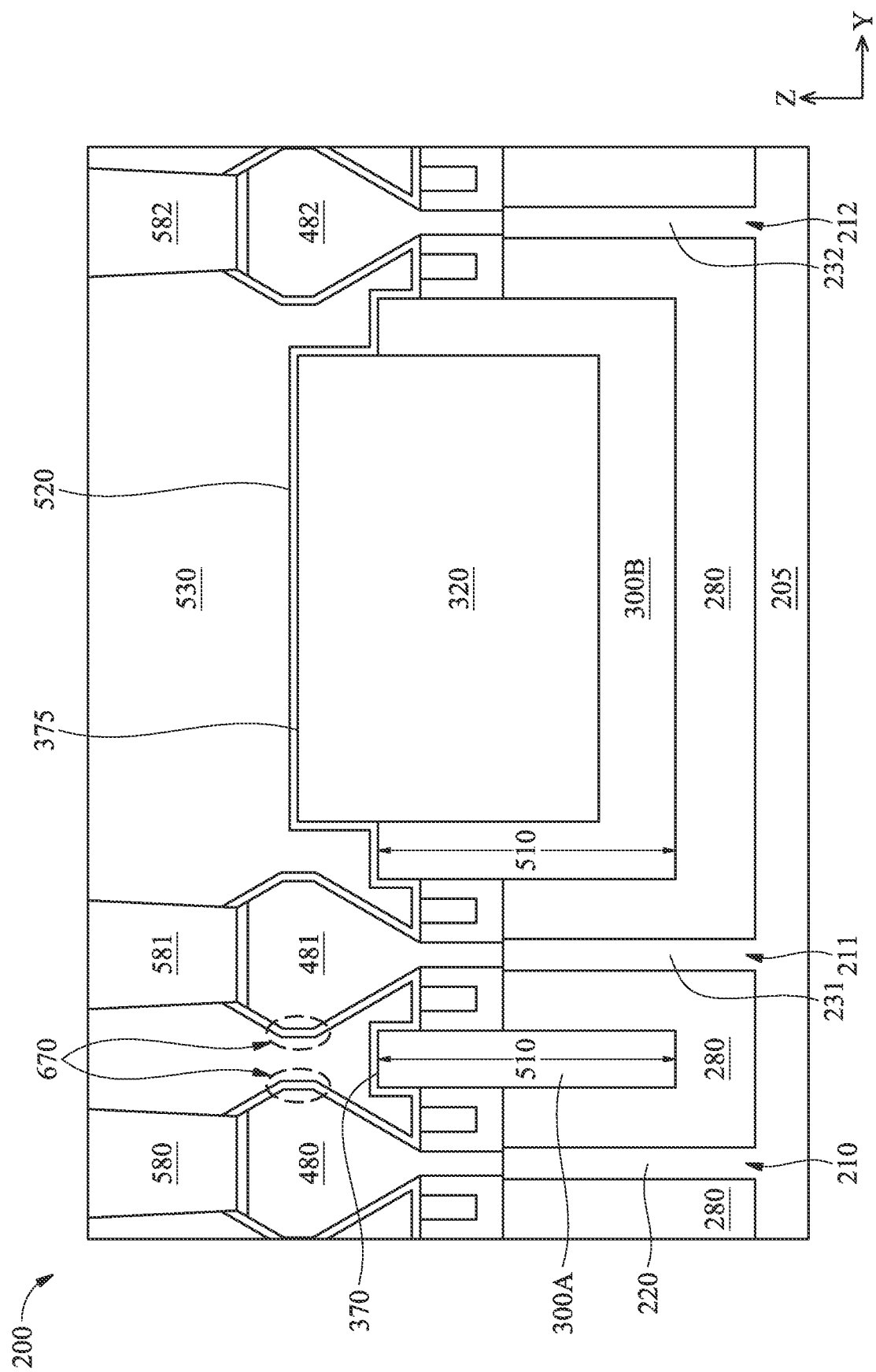
FIGS. 17-18 illustrate cross-sectional side views of a semiconductor device at a stage of fabrication according to embodiments of the present disclosure.
Figure 18:
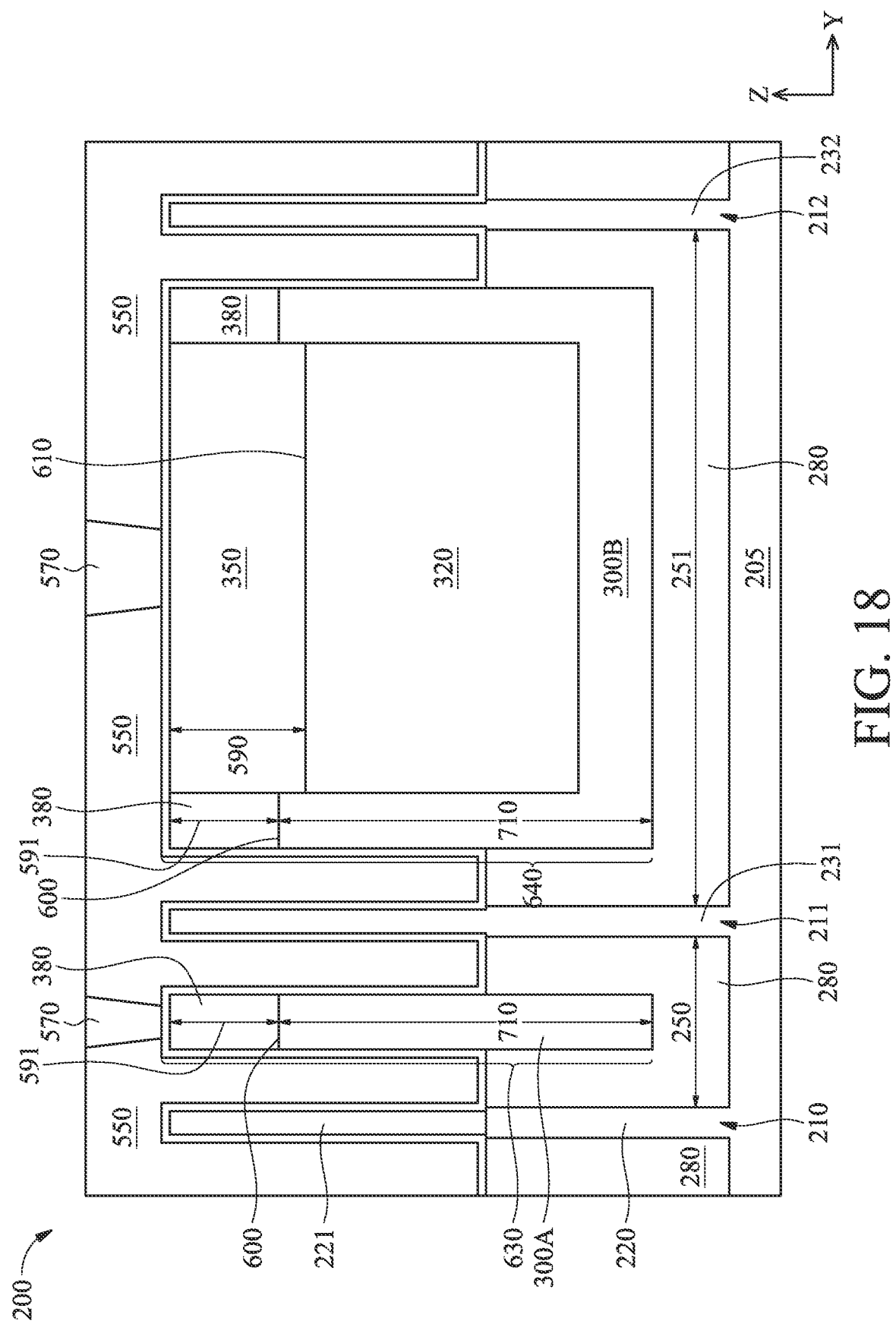
Figure 19:
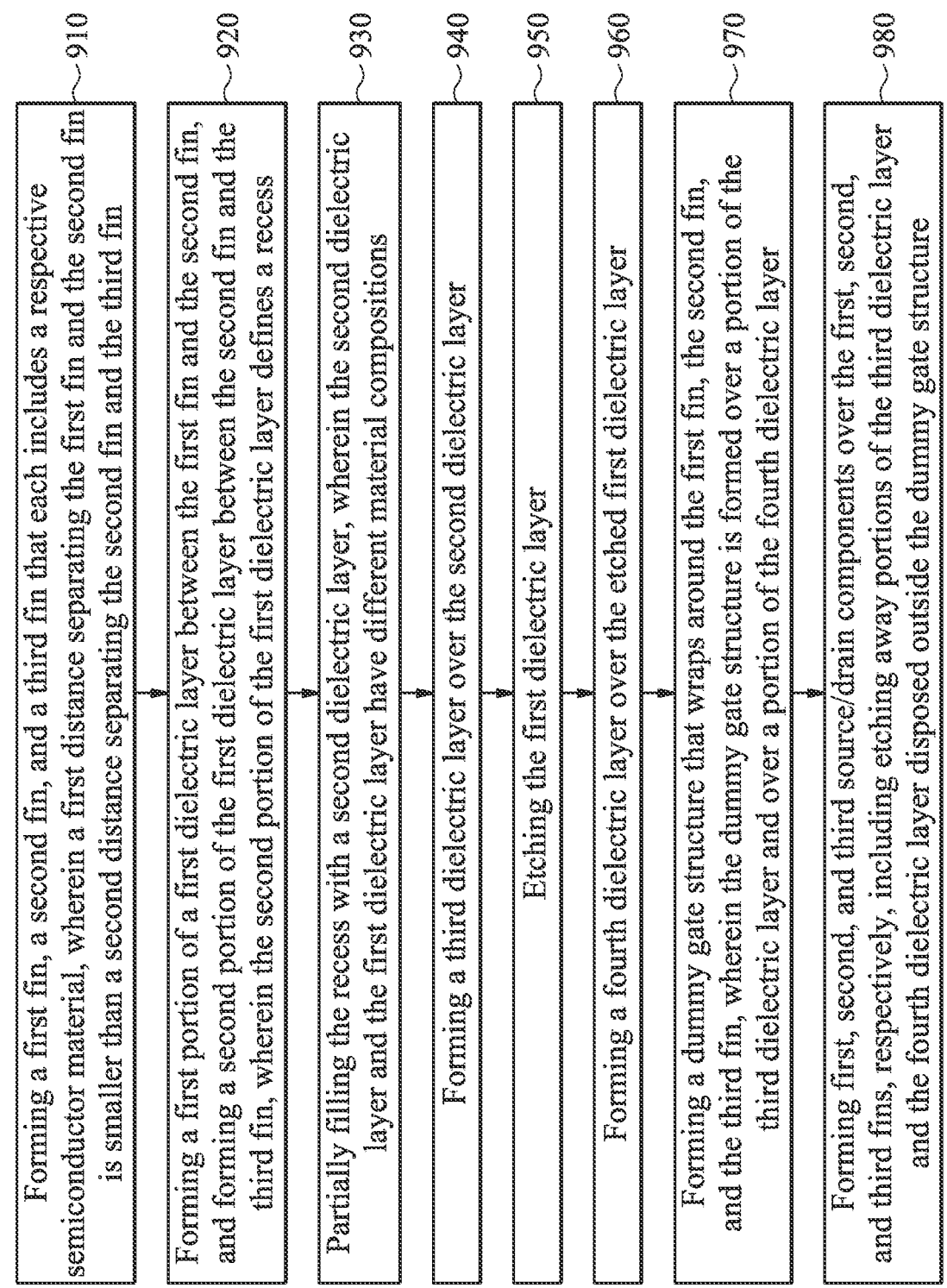
FIG. 19 is a flowchart illustrating a method of fabricating a semiconductor device according to an embodiment of the present disclosure.

To overcome the problems discussed above, the present disclosure forms dummy dielectric fins that have substantially reduced contribution to parasitic capacitance, but that are still capable of providing electrical isolation between adjacent epi-layers, as discussed in more detail below with reference to FIGS. 2-19. In that regard, FIGS. 2-16 are diagrammatic three-dimensional perspective views of a portion of a semiconductor device 200 at various stages of fabrication, FIGS. 17-18 are fragmentary cross-sectional side views of the semiconductor device 200 at a stage of fabrication, and FIG. 19 is a flowchart illustrating a method of fabricating the semiconductor device 200.

Figure 2:
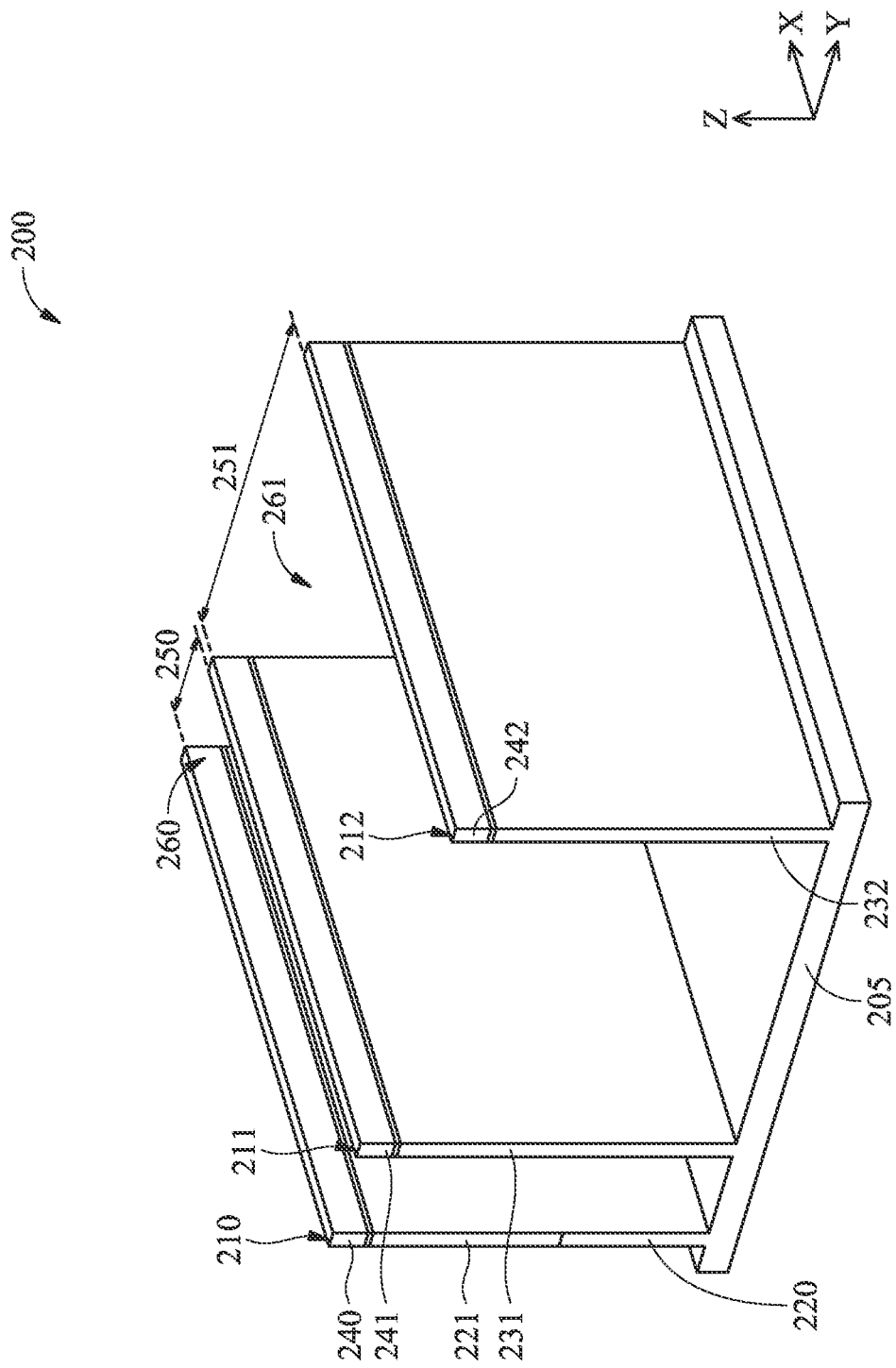
FIGS. 2-16 illustrate three-dimensional perspective views of a semiconductor device at various stages of fabrication according to embodiments of the present disclosure.

Referring now to FIG. 2, the semiconductor device 200 includes a substrate 205. The substrate 205 may include a bulk silicon substrate in some embodiments. In other embodiments, the substrate may include an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof. In further embodiments, the substrate may include a silicon-on-insulator (SOI) substrate. SOI substrates are fabricated using separation by implantation of oxygen, wafer bonding, and/or other suitable methods. The substrate may also include various isolation features, such as shallow trench isolation (STI) features and active regions defined by the STI features.

The semiconductor device 200 include fin structures such as fin structures 210-212. The fin structures 210-212 each vertically protrude in the Z-direction, extend in an elongated manner in the X-direction, and are separated from one another in the Y-direction, as shown in FIG. 2. For ease of reference, the fin structures 210-212 may be interchangeably referred to as device fins hereinafter, to be differentiated from the dummy fins discussed below.

The fin structures 210-212 may include both n-type fins and p-type fins. As a non-limiting example, the fin structure 210 may be a p-type fin, while the fin structures 211-212 may be n-type fins. P-type and n-type fins may include different types of semiconductive materials as their active regions. For example, the p-type fin structure 210 may include a silicon (Si) material 220 and a silicon germanium (SiGe) material 221 as its active region. Meanwhile, the n-type fin structures 211-212 may include silicon materials 231 and 232, respectively, as their active regions. In other embodiments, the fin structures 210-212 may include a III-V group compound such as gallium arsenide (GaAs), indium gallium arsenide (InGaAs), or indium phosphide (InP), etc.

The fin structures 210-212 also include hard masks 240-242. The hard masks 240-242 are formed by one or more patterning processes, and they are then used to define the shape of the active regions therebelow. In some embodiments, the hard masks 230-233 may include a dielectric material. In some embodiments, the hard masks 240-242 may each include multiple layers of hard masks, where each layer has its own type of dielectric material.

Note that the spacing the fin structures 210-212 may not be uniform. For example, a distance 250 (measured in the Y-direction) separates the fin structures 210-211, while a distance 251 (measured in the Y-direction) separates the fin structures 211-212. The distances 250 is substantially shorter than the distance 251. As such, it may be said that the distance 250 corresponds to a "dense" region of the semiconductor device 200, while the distance 251 corresponds to a "sparse" region of the semiconductor device 200. As will be discussed below, the dummy dielectric fins formed in the "dense" region and the "sparse" region will have different physical characteristics other than their different lateral dimensions. As shown in FIG. 2, a recess 260 defined by the substrate 205 and the fin structures 210-211 is substantially smaller than a recess 261 defined by the substrate 205 and the fin structures 211-212.

Figure 3:
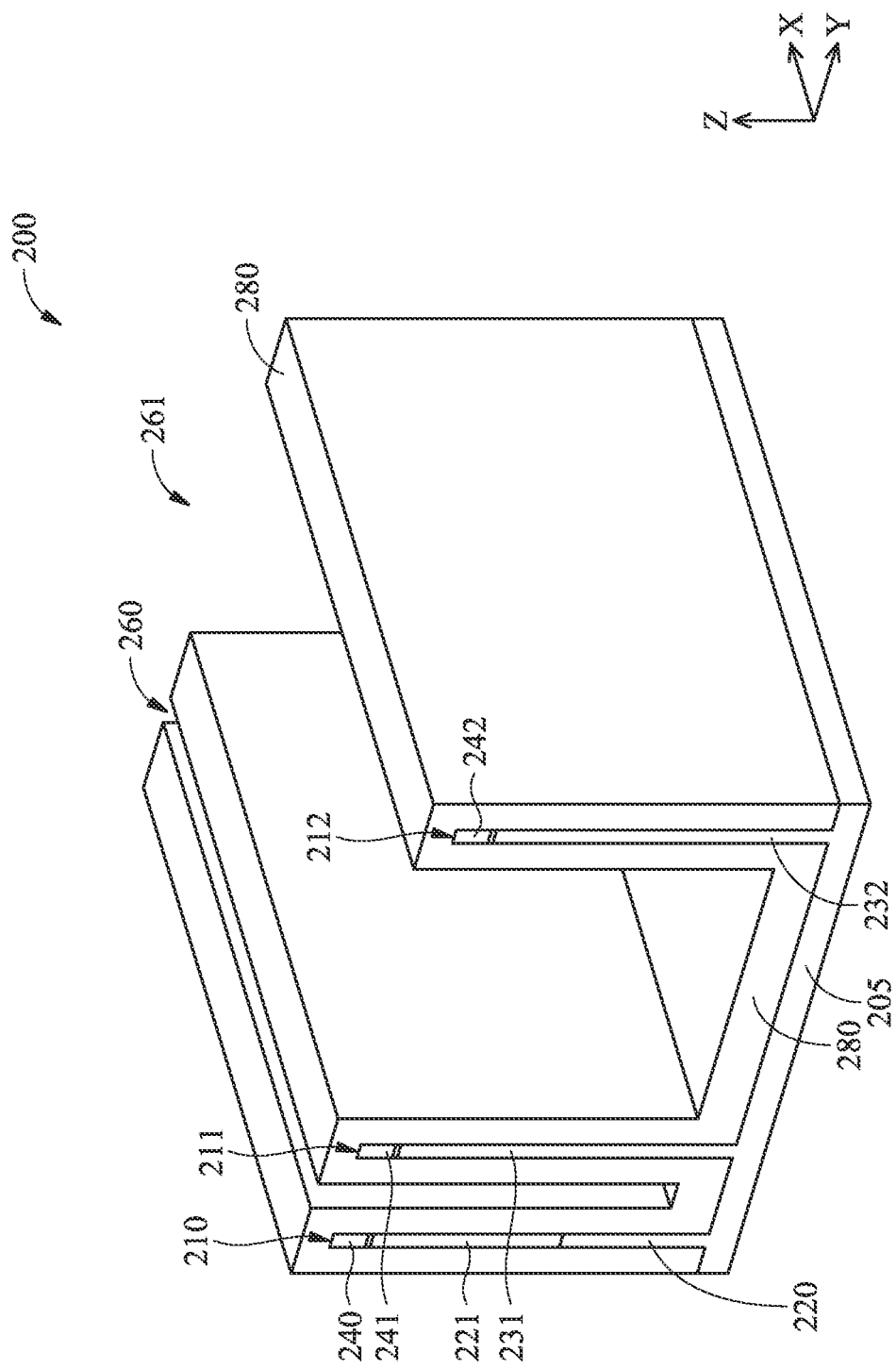

Referring now to FIG. 3, a spacer layer 280 is formed over the semiconductor device 200, for example over the upper surface of substrate 205 and over the upper surfaces and sidewalls of the fin structures 210-212. The spacer layer 280 may be deposited in a suitable deposition process such as CVD, PVD, ALD, or combinations thereof. The spacer layer 280 may include a dielectric material, such as silicon oxide, silicon nitride, silicon oxynitride, etc. In some embodiments, the formation of the spacer layer 280 may be conformal, for example the spacer layer 280 may be deposited with a substantially uniform thickness. The deposited spacer layer 280 partially fills in the recesses 260-261. It is understood that the spacer layer 280 may be considered an electrical isolation structure, for example an isolation structure that provides electrical isolation between the fin structures 210-212.

Figure 4:
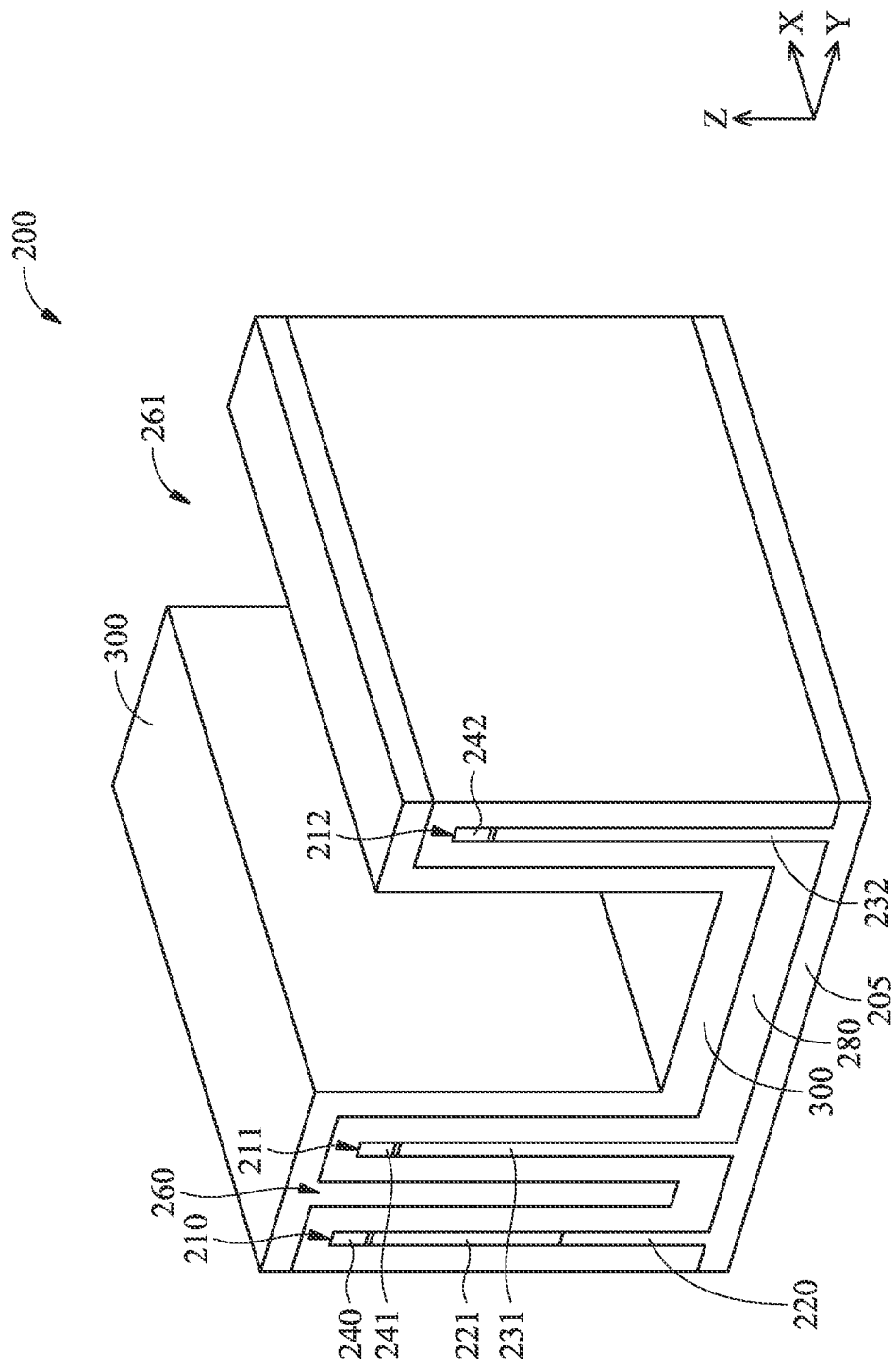

Referring now to FIG. 4, a low-k dielectric layer 300 is formed over the spacer layer 280. Again, the formation of the low-k dielectric layer 300 may include one or more suitable deposition processes such as CVD, PVD, ALD, or combinations thereof. The low-k dielectric layer 300 completely fills in the recess 260 and partially fills in the recess 261.

In some embodiments, the material of the low-k dielectric layer 300 is selected to include a dielectric material having a dielectric constant smaller than that of silicon dioxide (where the dielectric constant of silicon dioxide is about 4). As non-limiting examples, the low-k dielectric material may include silicon carbon nitride (SiCN), silicon nitride (SiN), silicon oxycarbide (SiC), silicon oxycarbon nitride (SiOCN), or combinations thereof. As will be discussed in greater detail below, portions of the low-k dielectric layer 300 will serve as dummy fins for the semiconductor device 200. As such, having a small dielectric constant helps to reduce the low-k dielectric layer 300's contribution to parasitic capacitance.

Figure 5:
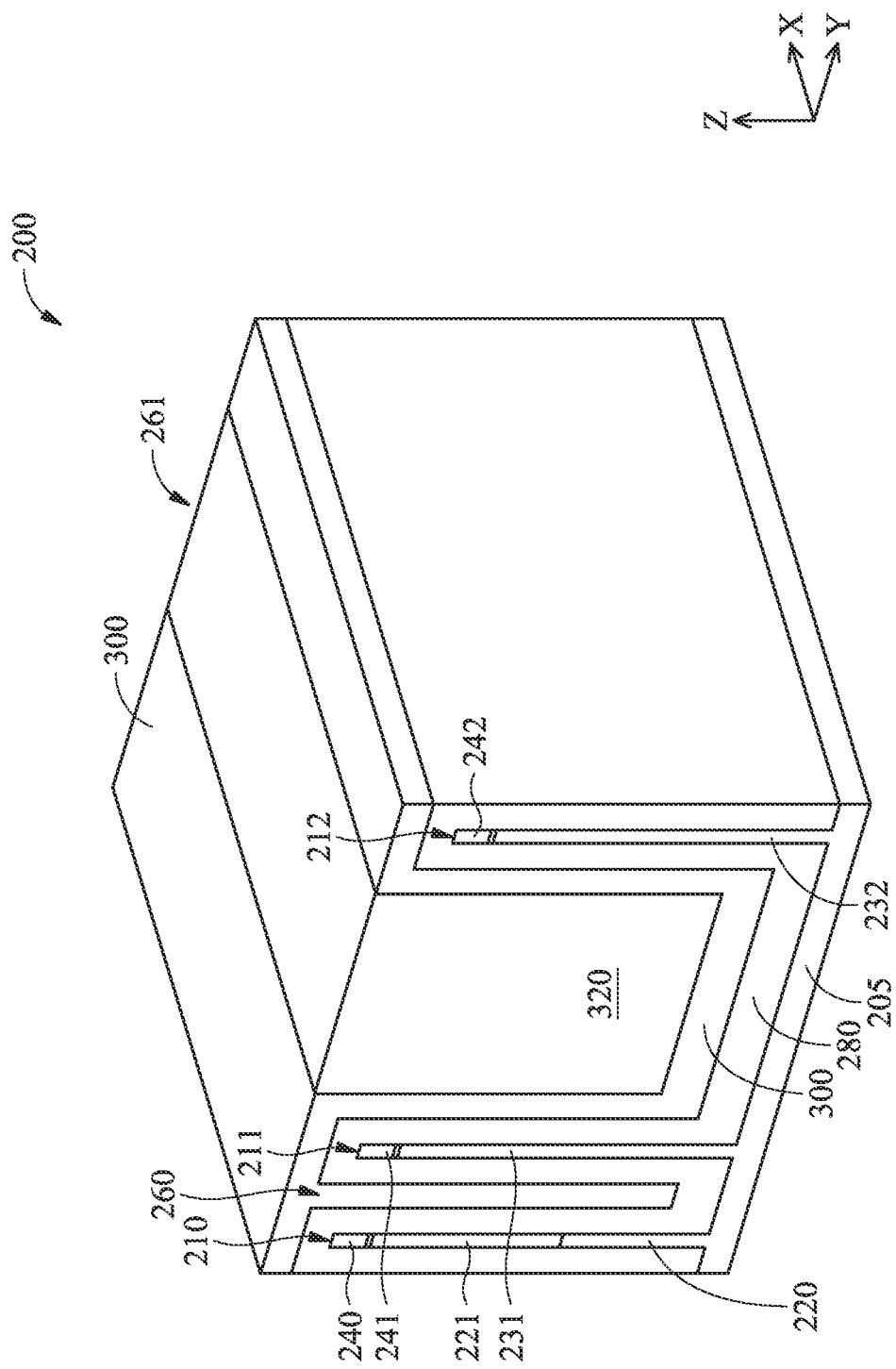

Referring now to FIG. 5, a dielectric layer 320 is formed to completely fill in the recess 261. The dielectric layer 320 has a different material composition than the low-k dielectric layer 300. For example, the dielectric layer 320 has a greater dielectric constant than the low-k dielectric layer 300. In some embodiments, the dielectric layer 320 includes an oxide material (e.g., silicon oxide), and the formation of the dielectric layer 320 includes a flowable process, such as a flowable CVD process. After the dielectric layer 320 has been formed, a planarization process such as a chemical mechanical polishing (CMP) process is performed to planarize the upper surfaces of the dielectric layer 320 and the low-k dielectric layer 300.

Figure 6:
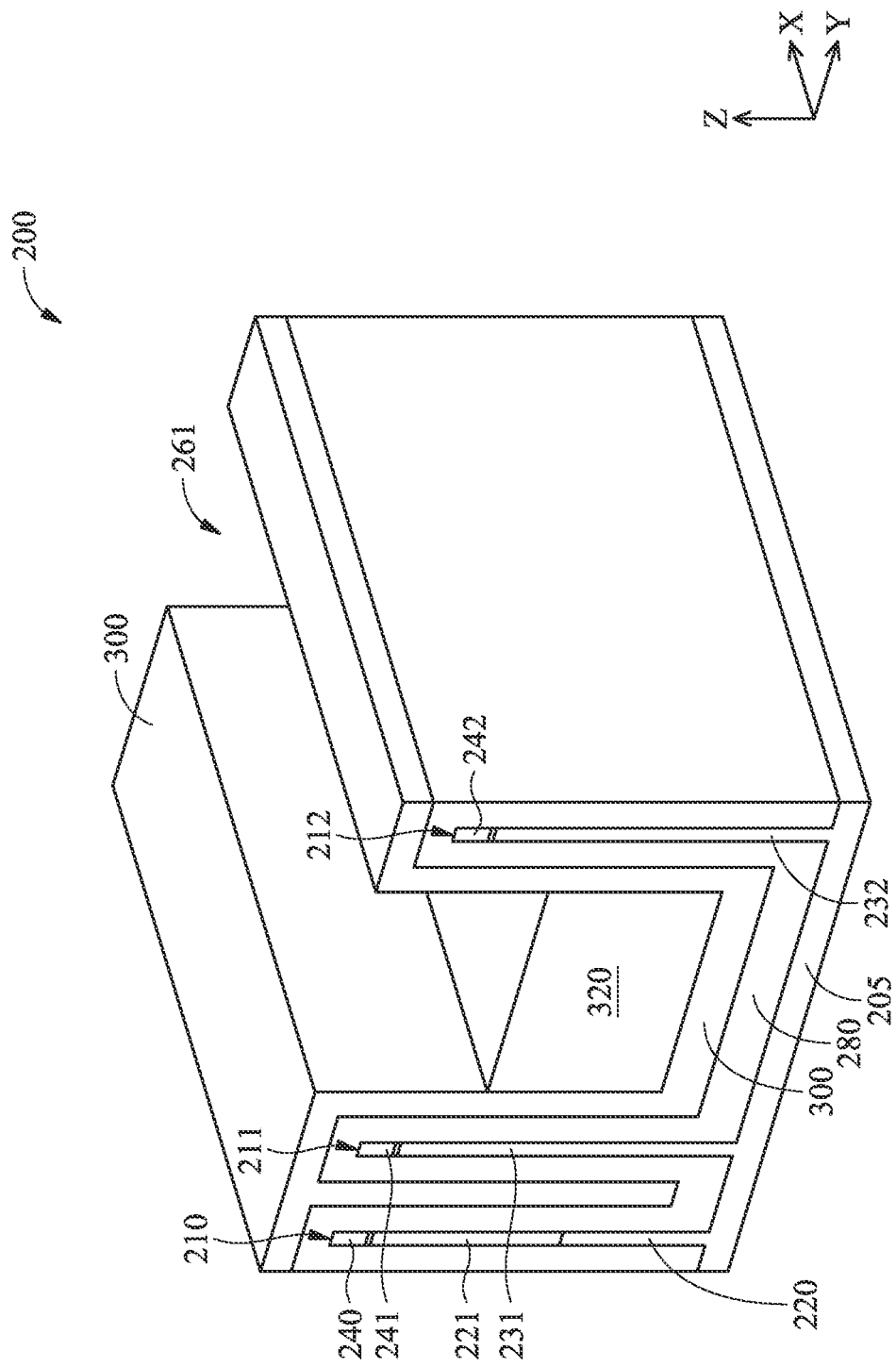

Referring now to FIG. 6, one or more etching processes may be performed to selectively remove a portion of the dielectric layer 320. The one or more etching processes may be configured to have an etching selectivity between the dielectric layer 320 and the low-k dielectric layer 300, such that portions of the dielectric layer 320 may be etched away without substantially affecting the low-k dielectric layer 300. The partial removal of the dielectric layer 320 allows the recess 261 to re-emerge. It is understood that the remaining portion of dielectric layer 320 may serve as an electrical isolation structure for the semiconductor device 200.

Figure 7:
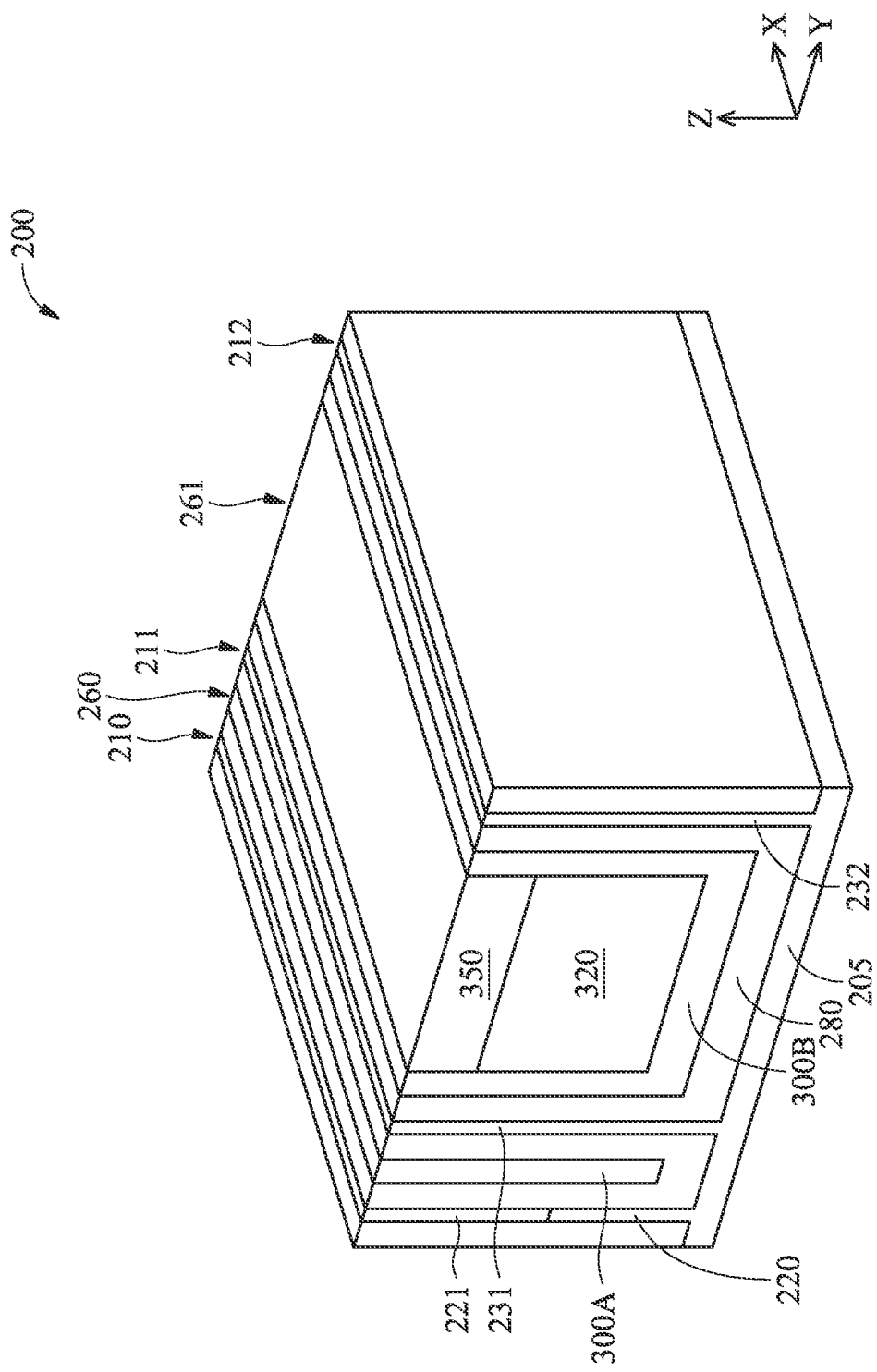

Referring now to FIG. 7, a high-k dielectric layer 350 is formed in the recess 261 and over the dielectric layer 320. The high-k dielectric layer 350 may include a dielectric material having a dielectric constant greater than that of silicon oxide. As such, the high-k dielectric layer 350 has a greater dielectric constant than both the dielectric layer 320 and the low-k dielectric layer 300. In some embodiments, the high-k dielectric layer 350 may include hafnium oxide ($HfO_2$), zirconium oxide ($ZrO_2$), hafnium aluminum oxide ($HfAlO_x$), hafnium silicon oxide ($HfSiO_x$), or combinations thereof.

A planarization process such as a CMP process may then be performed to planarize the upper surfaces of the various layers of the semiconductor device. The planarization process removes the hard masks 240-242 and portions of the low-k dielectric layer 300, portions of the high-k dielectric layer 350, and portions of the spacer layer 280, until the upper surfaces of the SiGe material 221 and/or the Si material 231-232 are exposed. Their upper surfaces are now substantially co-planar with the upper surfaces of the remaining portions of the spacer layer 280, the low-k dielectric layer 300, and the high-k dielectric layer 350.

At this stage of fabrication, the portion of the low-dielectric layer filling the recess 260 is designated as low-k dielectric layer 300A, which may be referred to as a dielectric dummy fin having a bar-like shape, since it resembles a vertically protruding bar in a cross-sectional view of the Y-Z plane. Meanwhile, the portion of the low-dielectric layer partially filling the recess 261 is designated as low-k dielectric layer 300B, which has a shape in a cross-sectional view (in the Y-Z plane) resembling the letter U. Also, the fin structure 210 is made up of the SiGe material 221 and the Si material 220, the fin structure 211 is made up of the Si material 231, and the fin structure 212 is made up of the Si material 232.

Figure 8:
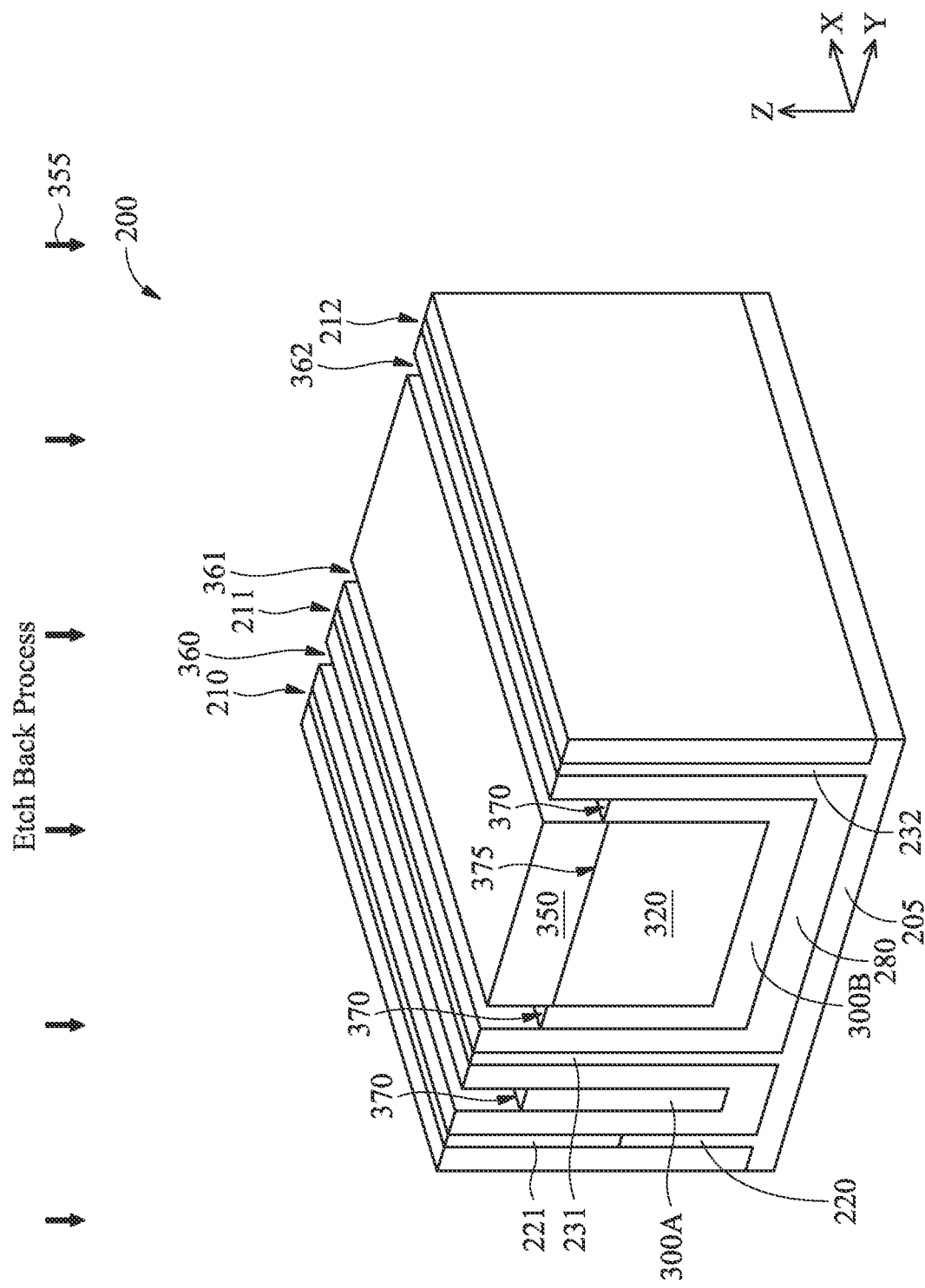

Referring now to FIG. 8, an etch back process 355 may be performed to the low-k dielectric layers 300A and 300B. The etch back process 355 is configured to have an etching selectivity between the low-k dielectric layers 300A-300B and the other layers of the semiconductor device 200, such that the removal of the low-k dielectric layers 300A-300B does not substantially affect the rest of the layers. The etching back of the low-k dielectric layer 300A forms a recess 360, and the etch backing of the low-k dielectric layer 300B forms recess 361 and 362.

Note that the upper surfaces 370 of the remaining portions of the low-k dielectric layers 300A-300B may not be co-planar with the upper surface 375 of the dielectric layer 320 (or with the bottom surface of the high-k dielectric layer 350). This is because the upper surface 375 of the dielectric layer 320 was defined when the one or more etching processes are performed to partially remove the dielectric layer 320 (as discussed above in association with FIG. 6), whereas the upper surfaces 370 of the low-k dielectric layers 300A-300B are defined by the etch back process performed in FIG. 8. In other words, the performance of two separate etching processes naturally leads to two different heights of the etched layers (e.g., the layers 320 and 300A-300B). Had the upper surfaces 370 and 375 of these layers been co-planar, that would have been a coincidence. In some embodiments, the upper surfaces 370 of the low-k dielectric layers 300A-300B are located at a higher level than the upper surface 375 of the dielectric layer 320. In other embodiments, the upper surfaces 370 of the low-k dielectric layers 300A-300B are located at a lower level than the upper surface 375 of the dielectric layer 320. The uneven upper surfaces 370 and 375 is one of the unique physical characteristics of the present disclosure, and it serve as evidence that a semiconductor device has been fabricated using the processes of the present disclosure discussed above.

Figure 9:
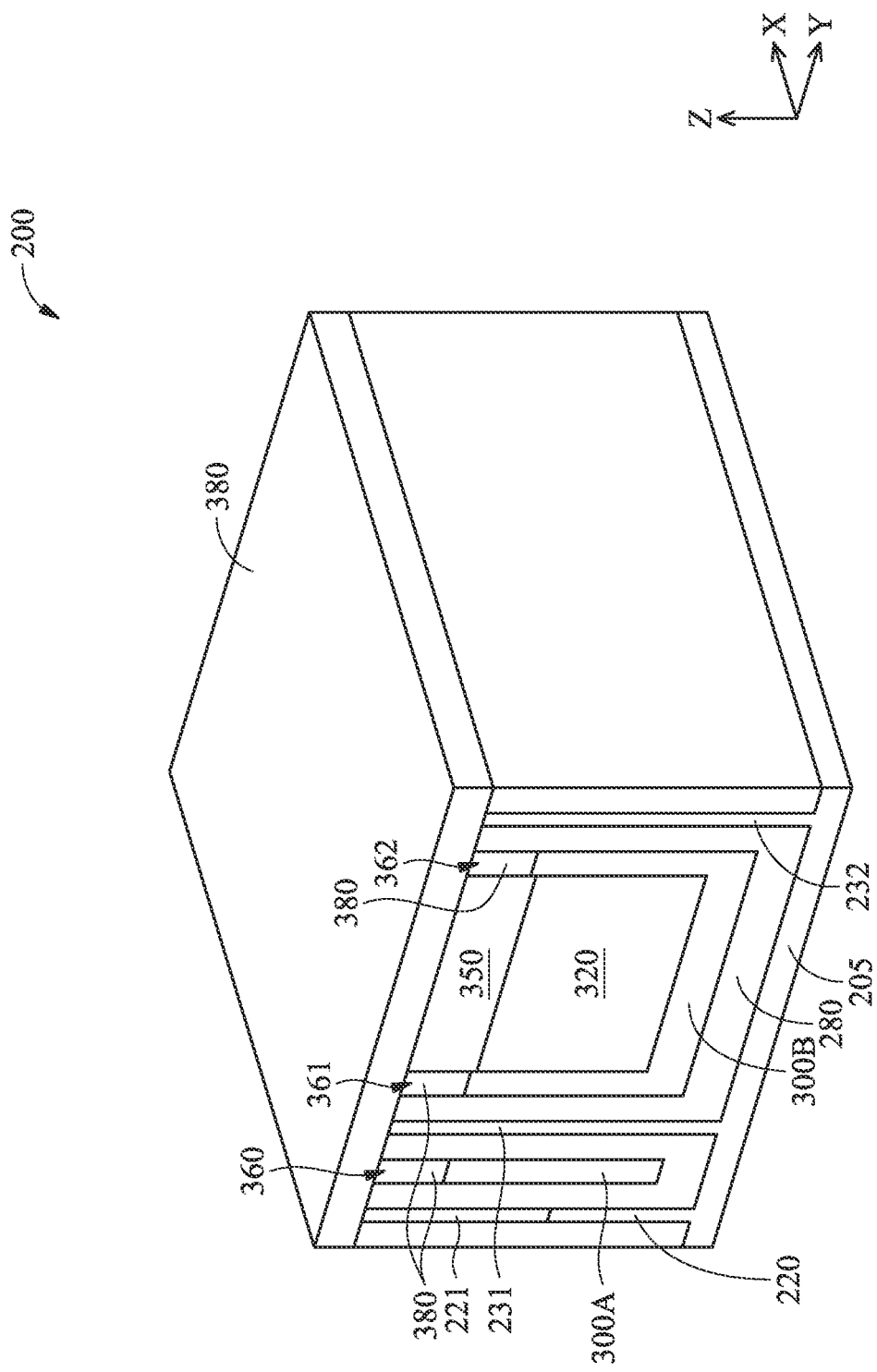

Referring now to FIG. 9, another high-k dielectric layer 380 is formed over the semiconductor device 200, including over the upper surfaces of the high-k dielectric layer 350 and the low-k dielectric layers 300A-300B. In some embodiments, the high-k dielectric layer 380 has a substantially identical material composition as the high-k dielectric layer 350. In other embodiments, the high-k dielectric layer 380 and the high-k dielectric layer 350 have different material compositions. As is shown in FIG. 9, portions of the high-k dielectric layer 380 fill the recesses 360-362. These portions of the high-k dielectric layers 380 will serve as "caps" or "helmets" of the dummy dielectric fins.

Figure 10:
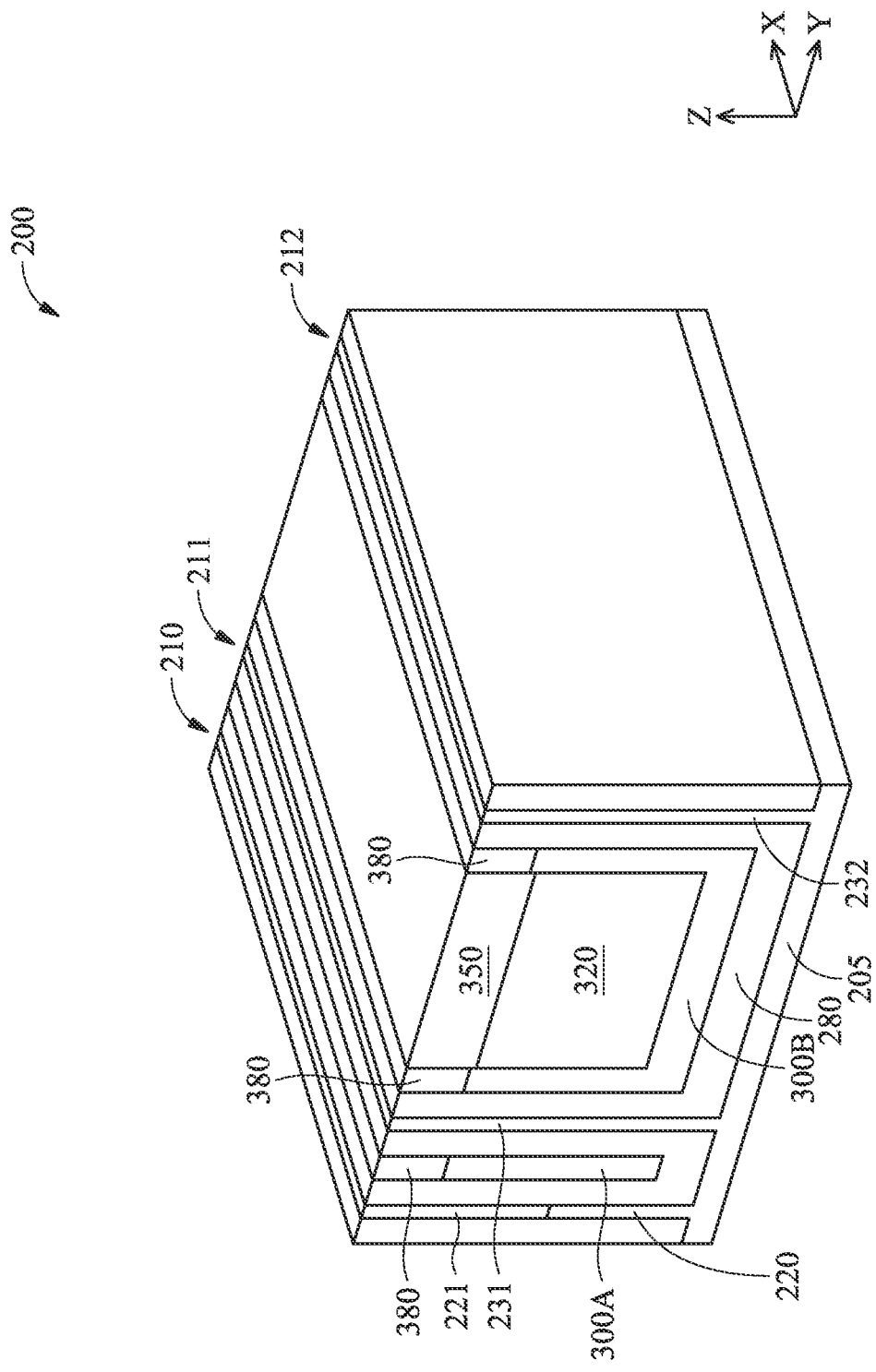

Referring now to FIG. 10, an etch back process is performed to the high-k dielectric layer 380. Portions of the high-k dielectric layer 380 are etched away until the upper surfaces of the fin structures 210-212 (e.g., the upper surfaces of the SiGe material 221 and the Si material 231-232) are exposed.

Figure 11:
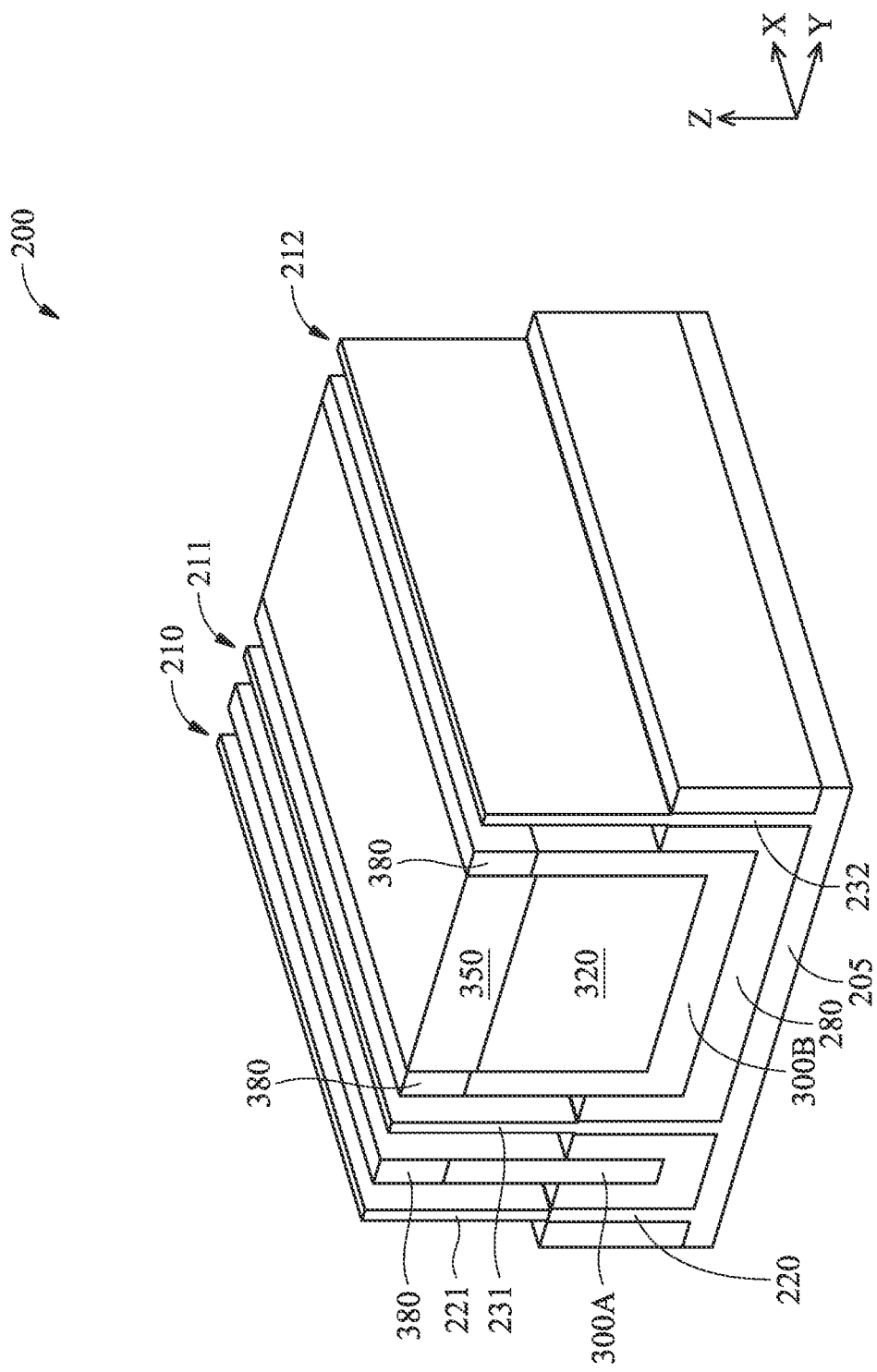

Referring now to FIG. 11, one or more etching processes are performed to the semiconductor device 200 to partially remove the spacer layer 280. For example, the one or more etching processes are configured to have an etching selectivity between the spacer layer 280 and the rest of the layers of the semiconductor device 200, such that the spacer layer 280 may be etched away without substantially affecting the rest of the layers. The partially removal of the spacer layer 280 exposes portions of the sidewalls of the fin structures 210-212, the low-k dielectric layers 300A-300B, and the high-k dielectric layer 380. In some embodiments, the one or more etching processes may be performed until most (if not all) of the sidewalls of the SiGe material 221 are substantially exposed.

Figure 12:
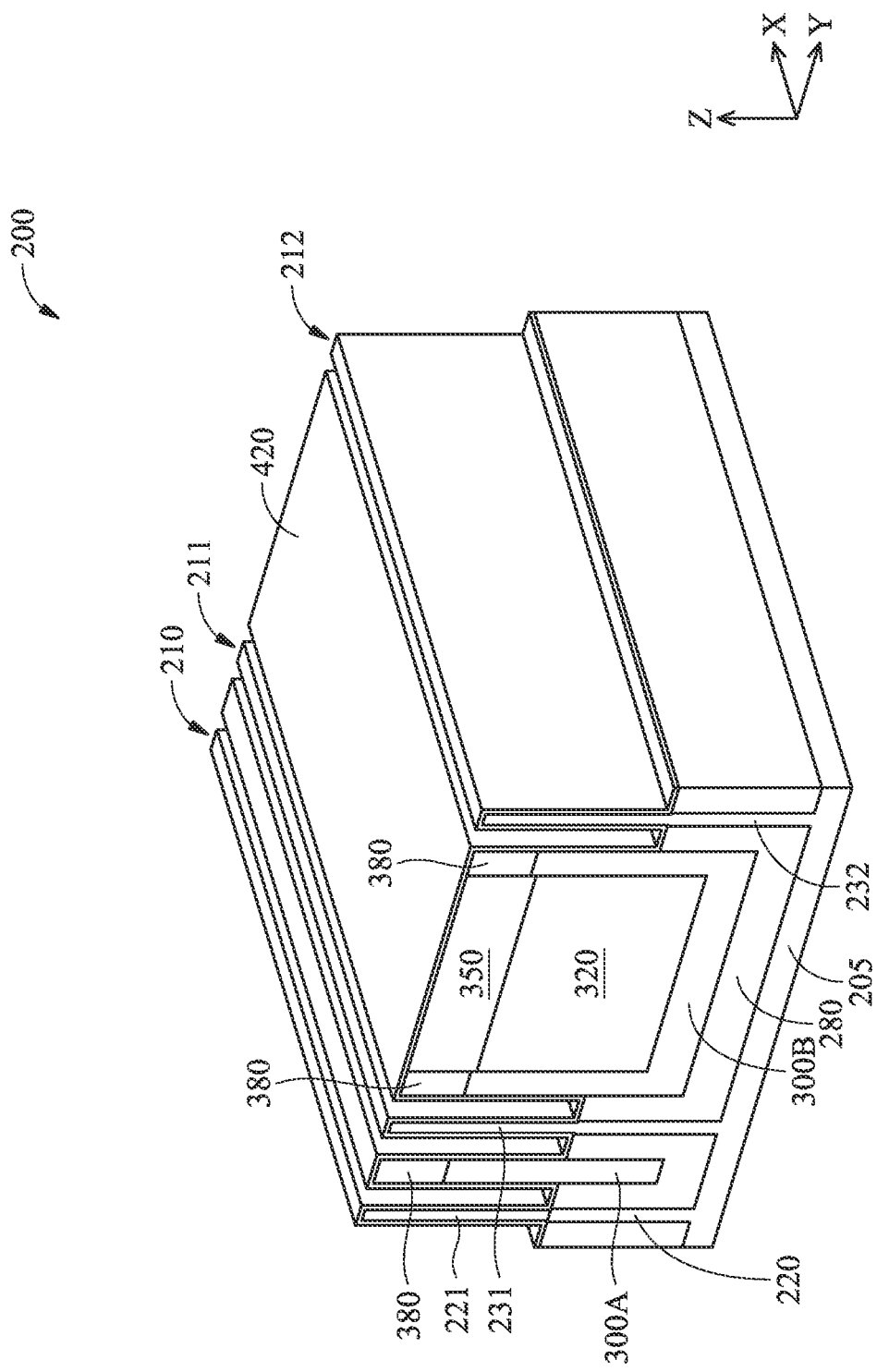

Referring now to FIG. 12, a deposition process is performed to form a dielectric layer 420 over the various layers of the semiconductor device 200. For example, the dielectric layer 420 is formed on the exposed top surfaces and side-walls of the fin structures 210-212, as well as on the exposed surfaces of the low-k dielectric layers 300A-300B and the high-k dielectric layers 350 and 380. In some embodiments, the dielectric layer 420 contains a material suitable for a gate dielectric (which may be a dummy gate electric), for example a silicon oxide material.

Figure 13:
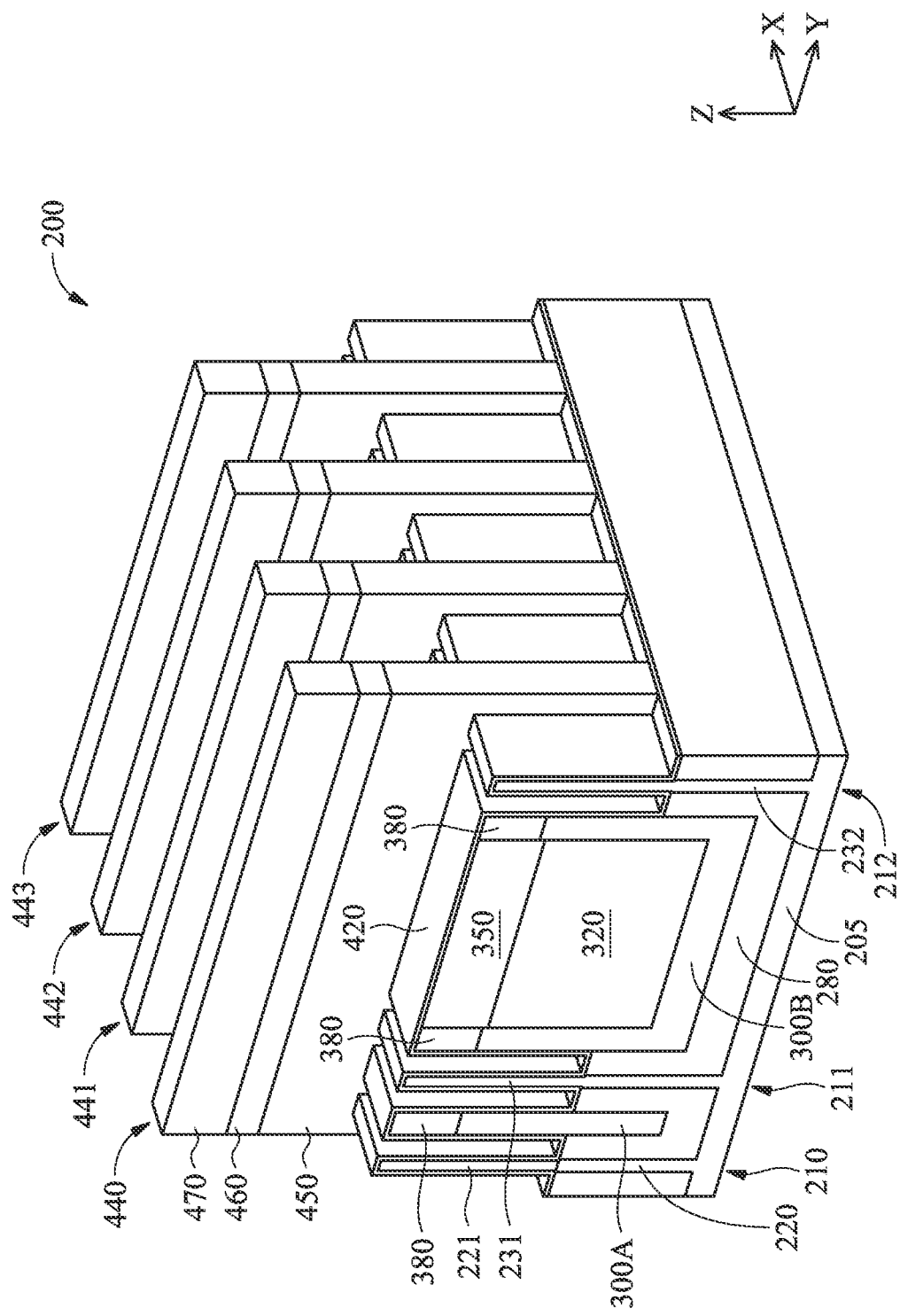

Referring now to FIG. 13, a plurality of gate structures such as gate structures 440-443 are formed over the semiconductor device 200. The gate structures 440-443 are formed by a plurality of deposition processes and patterning processes. The gate structures 440-443 each extend in an elongated manner in the Y-direction and are separated from each other in the X-direction. Each of the gate structures 440-443 also partially wrap around the top and side surfaces of the fin structures 210-212. In the illustrated embodiment, the gate structures 440-443 are dummy gate structures, which will be replaced by a gate replacement process discussed below. The gate structures 440-443 each include a dummy gate electrode 450, which may contain polysilicon. The gate structures 440-443 also include mask layers 460-470, which may be used to pattern or define the shape of the dummy gate electrode 450 therebelow.

Figure 14:
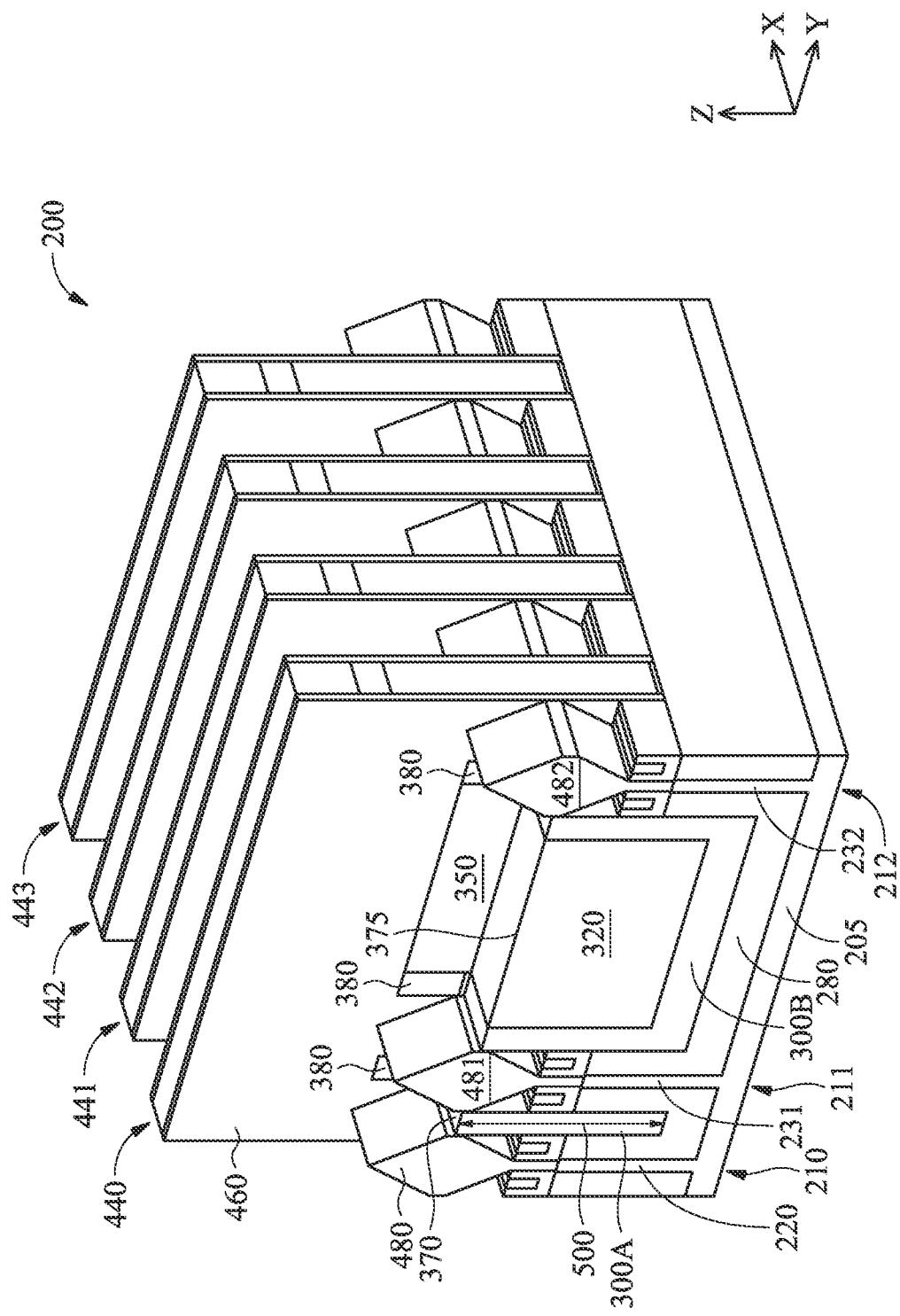

Referring now to FIG. 14, gate spacers 460 are formed on the sidewalls of the gate structures 440-443. The gate spacers 460 may include a dielectric material such as a low-k dielectric, silicon oxide, silicon nitride, etc. Thereafter, one or more etching processes may be performed to partially etch the fin structures 210-212, which reduces the height of the fin structures 210-212. It is understood that during the one or more etching processes, portions of the dielectric layer 420 and the high-k dielectric layers 350 and 380 that are disposed outside of the gate structures 440-443 are also etched away. In other words, the one or more etching processes herein are configured to consume the high-k dielectric layers 350 and 380 that are not disposed underneath the gate structures 440-443. As a result, the upper surfaces 370 of the low-k dielectric layers 300A-300B and the upper surface 375 of the dielectric layer 320 are exposed outside of the gate structures 440-443.

Source/drain components 480-482 are then epitaxially grown on the remaining portions of the fin structures 210-212. For example, a source/drain component 480 is epitaxially grown on the Si material 220 of the fin structure 210, and source/drain components 481-482 are epitaxially grown on the Si material 231-232 of the fin structures 211-212, respectively. The source/drain components 480-482 may each have a laterally protruding shape. For example, for each of the source/drain components 480-482, the width (e.g., lateral dimension measured in the Y-direction) gradually increases as a function of the height (in the Z-direction), until a maximum width is reached, and thereafter the width decreases as a function of height. In other words, the maximum width for each of the source/drain components 480-482 occurs somewhere near the middle portion of the source/drain components 480-482.

One function served by the low-k dielectric layer 300A is to prevent the bridging of the source/drain components 480-481. For example, without the low-k dielectric layer 300A as a dummy dielectric fin placed between the source/drain components 480-481, the source/drain components 480-481 could merge into each other as they are being epitaxially grown, since they are each laterally protruding in the Y-direction. The merging of the source/drain components 480-481 may cause electrical shorting between them, which is undesirable. Here, the present disclosure effectively prevents this problem because the low-k dielectric layer 300A effectively blocks the lateral epitaxial growth of the source/drain components 480-481 (if they extend that far laterally). Hence, electrical bridging risks are substantially reduced.

As shown in FIG. 14, the low-k dielectric layers 300A or 300B has a height 500 that is measured in the Z-direction. The height 500 is configured such that the low-k dielectric layer 300A can effectively block the merging of the source/drain components 480-481. For example, in some embodiments, the height 500 is tall enough such that the upper surface 370 is disposed near, or above, the outermost lateral protrusions of the source/drain components 480-481.

Figure 15:
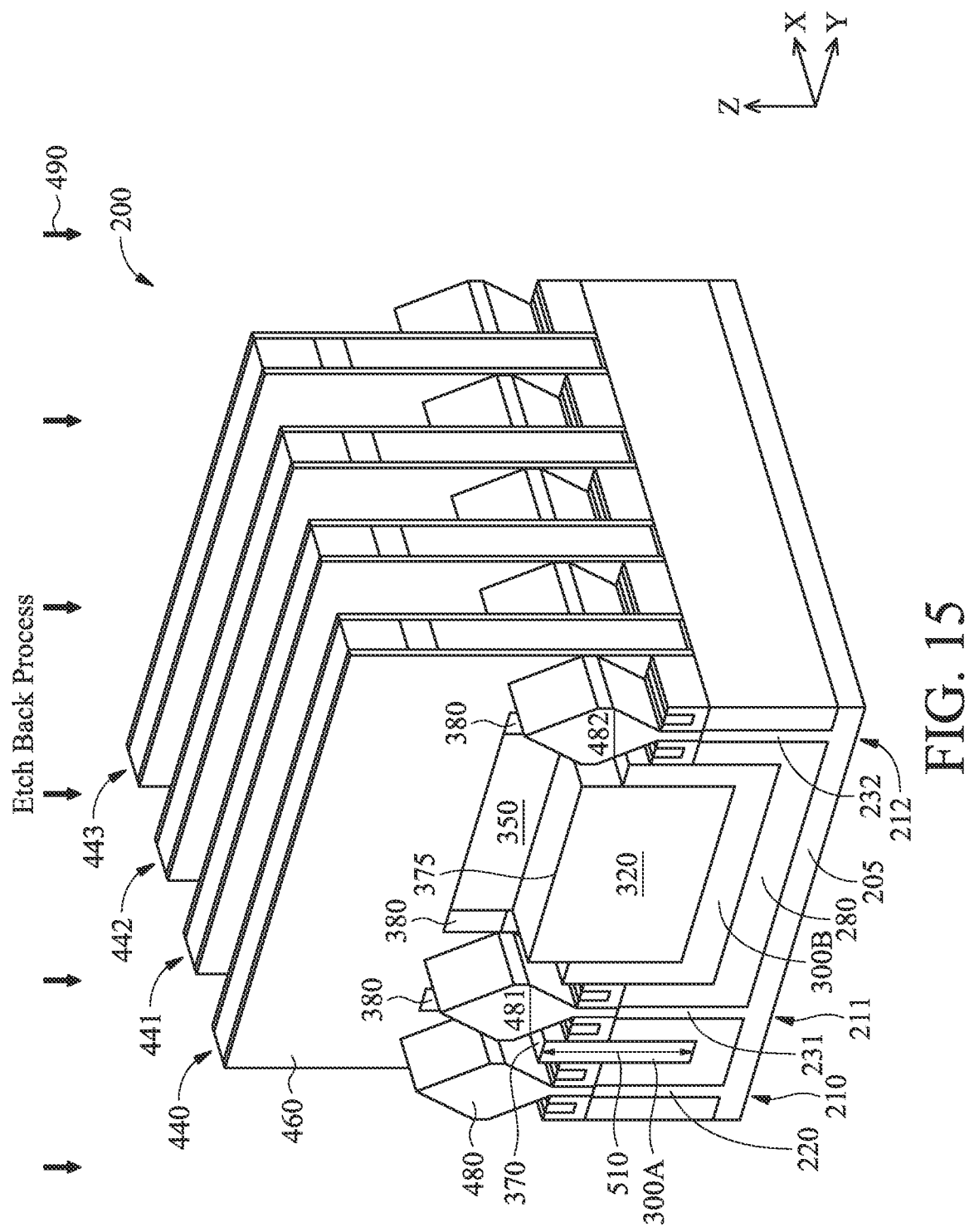

Referring now to FIG. 15, an etch back process 490 is performed to etch back the low-k dielectric layers 300A-300B (e.g., the dummy dielectric find) that are outside of the gate structures 440-443. The etched back low-k dielectric layers 300A-300B have a reduced height 510, which is less than the height 500 discussed above. For example, as shown in FIG. 15, due to the reduced height 510, the upper surface 370 of the low-k dielectric layer 300A is now disposed at a level below the outermost protrusion of the source/drain components 480-481.

The etching back of the low-k dielectric layer 300A is another unique process of the present disclosure, and its purpose is to reduce parasitic capacitance. As discussed above, existing FinFET devices may have excessive parasitic capacitance, particularly as device sizes continue to shrink. This is even more of a concern for high frequency applications. One contributing factor to parasitic capacitance is dummy dielectric fins, because the disposition of a dielectric dummy fin (such as the low-k dielectric layer 300A) between two conductive components (such as the source/drain components 480-481) mimics a parasitic capacitor. As the dielectric value of the dummy fin increases, so does the parasitic capacitance. Here, the choice of the low-k dielectric material for the dummy dielectric fin (i.e., the low-k dielectric layer 300A) lowers the dielectric value of the dummy dielectric fin, which helps to reduce parasitic capacitance. In addition, the reduction in height of the dummy dielectric fin (by the etch back process 490 of FIG. 15) further reduces the dielectric value of the dummy dielectric fin and therefore its contribution to parasitic capacitance. Consequently, the dummy dielectric fin of the present disclosure has substantially smaller parasitic capacitance than conventional FinFET devices. Advantageously, the reduced parasitic capacitance improves device performance such as speed, etc.

Figure 16:
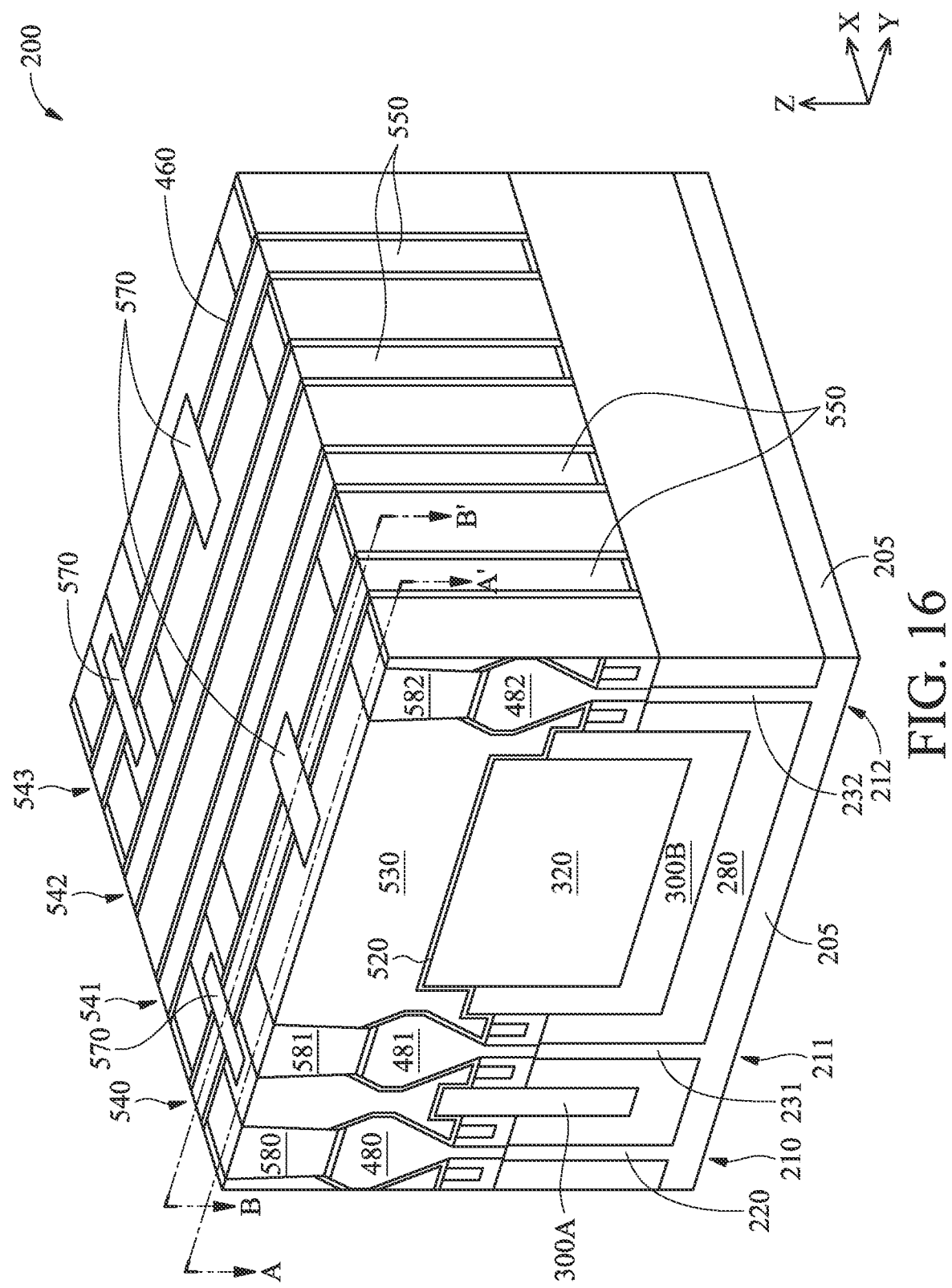

Referring now to FIG. 16, a capping layer 520 is formed over the source/drain components 480-482, the low-k dielectric layers 300A-300B, and the dielectric layer 320. An interlay dielectric (ILD) 530 is formed over the capping layer 520. The ILD 530 may also be referred to as an ILD0 layer. The ILD 530 may include a dielectric material, such as a low-k dielectric material (a dielectric material with a dielectric constant smaller than that of silicon dioxide). As non-limiting examples, the low-k dielectric material may include fluorine-doped silicon dioxide, carbon-doped silicon dioxide, porous silicon dioxide, porous carbon-doped silicon dioxide, spin-on organic polymeric dielectrics, spin-on silicon based polymeric dielectrics, or combinations thereof. Alternatively, the ILD0 layer may include silicon oxide or silicon nitride, or combinations thereof. Among other things, the ILD 530 provides electrical isolation between the various components of the semiconductor device 200.

A gate replacement process is performed. As a part of the gate replacement process, the gate structures 440-443 are replaced by gate structures 540-543, respectively. The dummy gate electrode 450 in each of the gate structures 440-443 is removed (e.g., using one or more etching processes) and replaced with a metal gate electrode 550. The metal gate electrode 550 may include one or more work function metal layers configured to tune a work function of the transistor, as well as one or more fill metal layers configured to serve as a main conductive portion of the metal gate electrode. In embodiments where a dummy gate dielectric (e.g., a silicon oxide gate dielectric) was also formed previously, the gate replacement process also replaces the dummy gate dielectric with a high-k gate dielectric. Examples of the high-k gate dielectric may include: hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, the like, or combinations thereof. In other embodiments, the high-k gate dielectric may have already been formed before the gate replacement process is performed and thus does not need to be replaced.

Dielectric isolation structures 570 may be formed to provide electrical isolation between adjacent metal gate electrodes 550. The dielectric isolation structures 570 may be formed by etching a recess downwardly (in the Z-direction) at least partially through the metal gate electrode 550 and the ILD 530, and subsequently filling the etched recess with a suitable dielectric material. Since the dielectric isolation structures 570 "cut" through or into the metal gate electrode 550, they may also be referred to as cut-metal-gate (CMG) features.

Conductive contacts may also be formed to provide electrical connectivity to the various components of the semiconductor device 200. For example, source/drain contacts 580-582 may be formed over the source/drain components 480-482, respectively. The source/drain contacts 580-582 may be formed by etching recesses in the ILD 530, where the recesses are vertically aligned with the source/drain components 480-482. The etched recesses are then filling with an electrically conductive material, such as a metal or a metal compound, to form the source/drain contacts 580-582.

To further illustrate the various unique physical characteristics of the semiconductor device 200, a cross-sectional side view taken along the cutline A-A' is shown in FIG. 17, and a cross-sectional side view taken along the cutline B-B' is shown in FIG. 18. In other words, FIG. 17 shows a cross-section corresponding to the source/drain components 480-482, and FIG. 18 shows a cross-section corresponding to one of the metal gate electrodes 550. The cross-sectional view in FIG. 17 may also be referred to as a source/drain cut, while the cross-sectional view in FIG. 18 may also be referred to as a gate cut.

As clearly illustrated in FIGS. 17-18, one unique physical characteristic of the semiconductor device 200 that is a result of the performance of the fabrication processes of the present disclosure is that the dummy dielectric fins in FIGS. 17 and 18 are different. For example, the dummy dielectric fin in FIG. 17 includes the low-k dielectric layers 300A and 300B and is substantially devoid of a high-k dielectric material. In contrast, the dummy dielectric fin in FIG. 18 includes not just the low-k dielectric layers 300A-300B, but also the high-k dielectric layers 380 and 350. This physical difference is attributed to the fact that the portions of the high-k dielectric layers 350 and 380 not protected by the dummy gate structures 440-443 were etched away when the source/drain components 480-482 were epitaxially grown, which is why the high-k dielectric layers 350-380 are absent in the cross-sectional view of FIG. 17 (e.g., the source/drain cut). Meanwhile, the portions of the high-k dielectric layers 350-380 under the dummy gate structures 440-443 were preserved, and as such they still remain in the semiconductor device 200 after the gate replacement process. Hence, the high-k dielectric layers 350-380 are visible as "helmets" over the low-k dielectric layers 300A-300B in the gate cut of FIG. 18.

Another unique physical characteristic of the semiconductor device 200 is the uneven bottom surfaces of the high-k dielectric layers 380 and 350. As discussed above, the high-k dielectric layer 350 and the high-k dielectric layer 380 are formed using two separate processes. As such, a bottom surface 600 of the high-k dielectric layer 380 (which is in physical contact with the top surface 370 of the low-k dielectric layer 300A or 300B) is located at a higher level in the Z-direction than a bottom surface 610 of the high-k dielectric layer 350 (which is in physical contact with the top surface 375 of the dielectric layer 320).

The uneven bottom surfaces of the high-k dielectric layers 350 and 380 may also be demonstrated by their different thicknesses. As shown in FIG. 18, the high-k dielectric layers 350 and 380 may have thicknesses 590 and 591, respectively. In some embodiments, the thickness 590 is in a range between about 5 nm and about 50 nm, and the thickness 591 is in a range between about 5 nm and about 50 nm, though it is understood that the thickness 590 and 591 are not equal to one another. These ranges are configured such that the high-k dielectric layers 350-380 are thin enough so that the portions thereof disposed outside the gate structures may be consumed (i.e., absent in the source/drain cut in FIG. 17), but thick enough so that the portions thereof under the gate structures can still protect the dielectric layers 300A-300B and 320 therebelow.

Also as discussed above with reference to FIG. 2 (and as shown in FIG. 18), the distance 250 between the fin structures 210-211 is substantially smaller than the distance 251 between the fin structures 211-212. As such, a dummy dielectric fin structure 630 formed by the low-k dielectric layer 300A and the high-k dielectric layer 380 located thereover may be considered to be located in the "dense" region of the semiconductor device 200, while a dummy dielectric fin structure 640 formed by the low-k dielectric layer 300B, the dielectric layer 320, and the high-k dielectric layers 350 and 380 located thereover may be considered to be located in the "sparse" region of the semiconductor device 200.

Aside from their different lateral dimensions, the dummy dielectric fin structures 630 and 640 have other different physical characteristics. For example, the dummy dielectric fin structure 640 has "uneven" bottom surfaces for the high-k dielectric layers 350-380 (since they were formed by two separate processes), whereas the dummy dielectric fin structure 630 does not. As another difference, the low-k dielectric layer 300A of the dummy dielectric fin structure 630 has a "bar-like" cross-sectional profile, whereas the low-k dielectric layer 300B of the dummy dielectric fin structure 640 has a "U-shaped" cross-sectional profile. Another difference is that the dummy dielectric fin structure 640 includes the dielectric layer 320, whereas the dummy dielectric fin structure 630 does not.

Yet another unique physical characteristic of the semiconductor device 200 (as a result of the fabrication processes discussed above being performed) is that the low-k dielectric layer 300A in FIG. 17 is shorter than the low-k dielectric layer 300A in FIG. 18. In more detail, as shown in FIGS. 15 and 17, the low-k dielectric layers 300A-300B have a height 510 measured in the Z-direction. In comparison, as shown in FIG. 18, the low-k dielectric layers 300A-300B have a height 710 measured in the Z-direction, where the height 710 is greater than the height 510. This height difference is due to the performance of the etch back process 490 (see FIG. 15). The portion of the low-k dielectric layers 300A-300B under the dummy gate structures 440-443 were protected during the etch back process 490, which is why they have a greater height than the portions of the low-k dielectric layers 300A-300B unprotected by the dummy gate structures 440-443. As discussed above, the reduction in height of the low-k dielectric layers 300A-300B is so that they will make a smaller contribution to the parasitic capacitance.

The reduction of the height of the low-k dielectric layers 300A-300B leads to another unique physical characteristic of the semiconductor device 200. As shown in FIG. 17, the upper surface 370 of the low-k dielectric layer 300A is located at a level below the outermost lateral protrusions 670 of the source/drain components 480-481. In some embodiments, the upper surface 370 is located about 0 nm to about 50 nm below the outermost lateral protrusions 670. This range is configured to allow the low-k dielectric layer 300A to have a sufficiently tall initial height that is capable of preventing the undesirable lateral merging between the source/drain components 480-481, but also to allow the height-reduced low-k dielectric layer 300A to minimize its contribution to parasitic capacitance.

Yet another unique physical characteristic of the semiconductor device 200 is that the dielectric isolation structures 570 (e.g., the CMG features) need not be formed as deep as in conventional FinFET devices. In more detail, CMG features in conventional FinFET devices may need to be formed to extend vertically all the way down to the layer 280, since the dummy dielectric fin structures 630-640 are absent in conventional FinFET devices. For trench filling reasons, the CMG features typically have a trapezoidal shape that is top-wide and bottom-narrow. As such, the CMG features in conventional FinFET devices may need to have a very wide lateral dimension (in the Y-direction) to ensure that it can extend vertically all the way down to an isolation structure such as an STI, because the bottom portion of the CMG feature may be quite narrow and would be hard to fill if the top is not sufficiently wide. This becomes increasingly difficult to achieve in real world fabrication as the device scaling down process continues. For example, it may be difficult to etch a trench with a sufficiently high aspect ratio to allow the CMG feature filling the trench to extend vertically all the way down to the STI. In addition, alignment or overlay issues may be more prone to occur, since any lateral shift of a very wide CMG feature may result in the inadvertent etching of components nearby (e.g., the fin structures 210-212).

In comparison, the presence of the dummy dielectric fin structures 630-640 means that the dielectric isolation structures 570 (e.g., the CMG features) herein need only to extend down to the upper surfaces of the high-k dielectric layers 350-380. Since this is a much shorter vertical distance, the dielectric isolation structures 570 can be formed to be smaller, which is easier to achieve. Alignment and overlay concerns are also reduced due to the smaller sizes of the dielectric isolation structures 570. For example, since the dielectric isolation structures 570 are relatively narrow, they could shift laterally without raising significant concerns of inadvertently causing etching damage to nearby components such as the fin structures 210-212. As such, process window is enlarged.

FIG. 19 is a flowchart illustrating a method 900 according to an embodiment of the present disclosure. The method 900 includes a step 910 of forming a first fin, a second fin, and a third fin that each includes a respective semiconductor material. A first distance separating the first fin and the second fin is smaller than a second distance separating the second fin and the third fin.

The method 900 includes a step 920 of forming a first portion of a first dielectric layer between the first fin and the second fin, and forming a second portion of the first dielectric layer between the second fin and the third fin. The second portion of the first dielectric layer defines a recess.

The method 900 includes a step 930 of partially filling the recess with a second dielectric layer. The second dielectric layer and the first dielectric layer have different material compositions.

The method 900 includes a step 940 of forming a third dielectric layer over the second dielectric layer.

The method 900 includes a step 950 of etching the first dielectric layer.

The method 900 includes a step 960 of forming a fourth dielectric layer over the etched first dielectric layer.

The method 900 includes a step 970 of forming a dummy gate structure that wraps around the first fin, the second fin, and the third fin. The dummy gate structure is formed over a portion of the third dielectric layer and over a portion of the fourth dielectric layer.

The method 900 includes a step 980 of forming first, second, and third source/drain components over the first, second, and third fins, respectively, including etching away portions of the third dielectric layer and the fourth dielectric layer disposed outside the dummy gate structure.

In some embodiments, the second dielectric layer is formed to have a greater dielectric constant than the first dielectric layer, and the third dielectric layer and the fourth dielectric layer are formed to each have a greater dielectric constant than the second dielectric layer.

In some embodiments, the etching the first dielectric layer and the forming the fourth dielectric layer are performed such that a bottom surface of the fourth dielectric layer is not co-planar with a bottom surface of the third dielectric layer.

In some embodiments, the forming the first, second, and third source/drain components comprises epitaxially growing the first, second, and third source/drain components over the first, second, and third fins, respectively. The first dielectric layer prevents a lateral merging between at least the first source/drain component and the second source/drain component during the epitaxially growing. The method may further include a step of reducing a height of the first dielectric layer after the first, second, and third source/drain components have been formed. In some embodiments, the reducing the height of the first dielectric layer is performed such that an upper surface of the first dielectric layer is disposed at a level below an outermost lateral protrusion of the first source/drain component or the second source/drain component.

It is understood that additional processes may be performed before, during, or after the steps 910-980 of the method 900. For example, the method 900 may include a gate replacement process, in which the dummy gate structure is replaced with a functional gate structure. As another example, a dielectric isolation structure may be formed that extends downwardly into the functional gate structure, such that a bottom surface of the dielectric isolation structure is in physical contact with a top surface of the third dielectric layer or with a top surface of the fourth dielectric layer. Gate contacts and source/drain contacts may also be formed. For reasons of simplicity, other additional steps are not discussed herein in detail.

In summary, the present disclosure forms dielectric structures such as dummy fins in FinFET fabrication. The dummy fins may be initially formed to have a low-k dielectric layer and a high-k dielectric helmet. The high-k dielectric helmets are preserved in portions of the dummy fins located below the gate, but they are removed in portions of the dummy fins located outside the gate (e.g., between source/drain components), in order to minimize the contribution to parasitic capacitance. After the epitaxial growth of the source/drain, the portion of the low-k dielectric layer outside the gate is also etched to reduce its height, so as to further reduce its impact to parasitic capacitance.

Based on the above discussions, it can be seen that the present disclosure offers advantages over conventional FinFET devices. It is understood, however, that other embodiments may offer additional advantages, and not all advantages are necessarily disclosed herein, and that no particular advantage is required for all embodiments. One advantage is that the implementation of the dummy fins using low-k dielectric materials lessens their contribution to parasitic capacitance, since parasitic capacitance is directly correlated with dielectric constant. Another advantage is that the high-k dielectric helmet is removed for the portion of the dummy fin located between source/drain components, which further reduces parasitic capacitance. Yet another advantage is that the height of the low-k dielectric layer of the dummy fin is reduced after the epitaxial growth of the source/drain components, which again helps to reduce the parasitic capacitance. One more advantage is that the CMG features need not be cut so deep, since they can now stop at the upper surfaces of the dummy fins. Not only are the CMG features easier to form due to their shallower depths, process window is also enlarged, since any lateral shifting of the CMG features is less likely cause inadvertent etching damage to nearby components. Other advantages include compatibility with existing FinFET fabrication, so the present disclosure does not require additional processing and is therefore easy and cheap to implement.

The advanced lithography process, method, and materials described above can be used in many applications, including fin-type field effect transistors (FinFETs). For example, the fins may be patterned to produce a relatively close spacing between features, for which the above disclosure is well suited. In addition, spacers used in forming fins of FinFETs, also referred to as mandrels, can be processed according to the above disclosure.

One aspect of the present disclosure pertains to a semiconductor device. The semiconductor device includes a first device fin, a second device fin, a first source/drain component epitaxially grown over the first device fin, a second source/drain component epitaxially grown over the second device fin, a first dummy fin structure disposed between the first device fin and the second device fin, and a gate structure that partially wraps around the first device fin, the second device fin, and the first dummy fin structure. A first portion of the first dummy fin structure is disposed between the first source/drain component and the second source/drain component and outside the gate structure. A second portion of the first dummy fin structure is disposed underneath the gate structure. The first portion of the first dummy fin structure and the second portion of the first dummy fin structure have different physical characteristics.

Another aspect of the present disclosure pertains to a semiconductor device. The semiconductor device includes a first semiconductor fin, a second semiconductor fin, and a third semiconductor fin each vertically protruding out of a substrate. A first distance separating the first semiconductor fin and the second semiconductor fin is smaller than a second distance separating the second semiconductor fin and the third semiconductor fin. The semiconductor device includes a gate structure formed over and partially wrapping around the first semiconductor fin, the second semiconductor fin, and the third semiconductor fin. The semiconductor device includes a first dielectric fin structure disposed between the first semiconductor fin and the second semiconductor fin. A first portion of the first dielectric fin structure located below the gate structure includes a first low-k dielectric layer and a first high-k dielectric layer disposed over the first low-k dielectric layer. The semiconductor device includes a second dielectric fin structure disposed between the second semiconductor fin and the third semiconductor fin. A first portion of the second dielectric fin structure located below the gate structure includes a second low-k dielectric layer, an oxide layer disposed over the second low-k dielectric layer, a second high-k dielectric layer disposed over the oxide layer, and a third high-k dielectric layer disposed over the second low-k dielectric layer. The second high-k dielectric layer and the third high-k dielectric layer have uneven bottom surfaces.

Yet another aspect of the present disclosure pertains to a method of fabricating a semiconductor device. A first fin, a second fin, and a third fin are formed that each includes a respective semiconductor material. A first distance separating the first fin and the second fin is smaller than a second distance separating the second fin and the third fin. A first portion of a first dielectric layer is formed between the first fin and the second fin. A second portion of the first dielectric layer is formed between the second fin and the third fin. The second portion of the first dielectric layer defines a recess. The recess is partially filled with a second dielectric layer. The second dielectric layer and the first dielectric layer have different material compositions. A third dielectric layer is formed over the second dielectric layer. The first dielectric layer is etched. A fourth dielectric layer is formed over the etched first dielectric layer. A dummy gate structure is formed that wraps around the first fin, the second fin, and the third fin. The dummy gate structure is formed over a portion of the third dielectric layer and over a portion of the fourth dielectric layer. First, second, and third source/drain components are formed over the first, second, and third fins, respectively. This includes etching away portions of the third dielectric layer and the fourth dielectric layer disposed outside the dummy gate structure.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure. For example, by implementing different thicknesses for the bit line conductor and word line conductor, one can achieve different resistances for the conductors. However, other techniques to vary the resistances of the metal conductors may also be utilized as well.

What is claimed is:

1. A method, comprising:
   forming plurality of fin structures that each protrude out of a substrate;
   forming a first dielectric layer over the fin structures;
   forming a second dielectric layer over the first dielectric layer;
   forming a third dielectric layer over the second dielectric layer;
   etching back the first dielectric layer after a formation of the third dielectric layer;
   forming a fourth dielectric layer over the first dielectric layer and the third dielectric layer after the etching back of the first dielectric layer;
   etching back the fourth dielectric layer;
   forming gate structures over the fin structures; and
   forming source/drain components over the fin structures.

2. The method of claim 1, wherein:
   the fin structures include a first fin structure, a second fin structure, and a third fin structure; and
   the second fin structure is located between the first fin structure and the third fin structure but is located closer to the first fin structure than to the third fin structure.

3. The method of claim 1, further comprising: partially removing the second dielectric layer after the second dielectric layer has been formed over the first dielectric layer, wherein the third dielectric layer is formed over the second dielectric layer after the second dielectric layer has been partially removed.

4. The method of claim 1, wherein the etching back is configured to have an etching selectivity between the first dielectric layer and the third dielectric layer such that the first dielectric layer is etched back without substantially etching the third dielectric layer.

5. The method of claim 1, wherein a portion of the fourth dielectric layer is formed to be in physical contact with a side surface of the third dielectric layer.

6. The method of claim 1, further comprising:
   before the forming of the first dielectric layer, forming a spacer layer over an upper surface of the substrate and over upper surfaces and side surfaces of the fin structures; and
   after the etching back the fourth dielectric layer but before the forming the gate structures, etching the spacer layer.

7. The method of claim 6, further comprising: after the etching of the spacer layer but before the forming of the gate structures, depositing a fifth dielectric layer over at least the third dielectric layer.

8. The method of claim 1, wherein the forming the gate structures comprises forming dummy gate structures.

9. The method of claim 1, wherein the gate structures are formed over portions of the third dielectric layer and the fourth dielectric layer.

10. The method of claim 1, further comprising etching away portions of the third dielectric layer and the fourth dielectric layer disposed outside the gate structures before the forming of the source/drain components.

11. The method of claim 1, wherein:
the second dielectric layer is formed to have a greater dielectric constant than the first dielectric layer; and
the third dielectric layer and the fourth dielectric layer are formed to each have a greater dielectric constant than the second dielectric layer.

12. A method, comprising:
forming a first fin, a second fin, and a third fin that each includes a respective semiconductor material, wherein the second fin is formed between the first fin and the third fin, and wherein the second fin is located closer to the first fin than to the third fin such that a first trench formed between the first fin and the second fin is substantially narrower than a second trench formed between the second fin and the third fin;
depositing a first dielectric layer over the first fin, the second fin, and the third fin, wherein a first segment of the first dielectric layer completely fills the first trench, and a second segment of the first dielectric layer partially fills the second trench;
completely filling the second trench with a second dielectric layer;
etching back the second dielectric layer;
forming a third dielectric layer over the second dielectric layer;
performing a planarization process to partially remove the third dielectric layer and the first dielectric layer, wherein a remaining portion of the first segment of the first dielectric layer forms a dielectric fin after the planarization process;
forming a dummy gate structure over the first fin, the second fin, and the third fin, wherein the dummy gate structure is formed over at least a portion of the third dielectric layer; and
epitaxially growing first, second, and third source/drain components over the first, second, and third fins, respectively, wherein the dielectric fin prevents a lateral merging between at least the first source/drain component and the second source/drain component during the epitaxially growing.

13. The method of claim 12, further comprising:
etching back the dielectric fin; and
after the dielectric fin has been etched back, forming a fourth dielectric layer over the dielectric fin.

14. The method of claim 12, further comprising:
replacing the dummy gate structure with a functional gate structure; and
forming a dielectric isolation structure that extends downwardly into the functional gate structure, such that a bottom surface of the dielectric isolation structure is in physical contact with a top surface of the third dielectric layer.

15. A method, comprising:
forming a first fin, a second fin, and a third fin that each includes a respective semiconductor material, wherein a first distance separating the first fin and the second fin is smaller than a second distance separating the second fin and the third fin;
forming a first portion of a first dielectric layer between the first fin and the second fin, and forming a second portion of the first dielectric layer between the second fin and the third fin, wherein the second portion of the first dielectric layer defines a recess;
partially filling the recess with a second dielectric layer, wherein the second dielectric layer and the first dielectric have different material compositions;
forming a third dielectric layer over the second dielectric layer;
etching the first dielectric layer;
forming a fourth dielectric layer over the etched first dielectric layer;
forming a dummy gate structure that wraps around the first fin, the second fin, and the third fin, wherein the dummy gate structure is formed over a portion of the third dielectric layer and over a portion of the fourth dielectric layer; and
forming first, second, and third source/drain components over the first, second, and third fins, respectively, including etching away portions of the third dielectric layer and the fourth dielectric layer disposed outside the dummy gate structure.

16. The method of claim 15, wherein:
the second dielectric layer is formed to have a greater dielectric constant than the first dielectric layer; and
the third dielectric layer and the fourth dielectric layer are formed to each have a greater dielectric constant than the second dielectric layer.

17. The method of claim 15, wherein the etching the first dielectric layer and the forming the fourth dielectric layer are performed such that a bottom surface of the fourth dielectric layer is not co-planar with a bottom surface of the third dielectric layer.

18. The method of claim 15, wherein:
the forming the first, second, and third source/drain components comprises epitaxially growing the first, second, and third source/drain components over the first, second, and third fins, respectively; and
the first dielectric layer prevents a lateral merging between at least the first source/drain component and the second source/drain component during the epitaxially growing;
wherein the method further comprises: reducing a height of the first dielectric layer after the first, second, and third source/drain components have been formed.

19. The method of claim 18, wherein the reducing the height of the first dielectric layer is performed such that an upper surface of the first dielectric layer is disposed at a level below an outermost lateral protrusion of the first source/drain component or the second source/drain component.

20. The method of claim 15, further comprising:
replacing the dummy gate structure with a functional gate structure; and
forming a dielectric isolation structure that extends downwardly into the functional gate structure, such that a bottom surface of the dielectric isolation structure is in physical contact with a top surface of the third dielectric layer or with a top surface of the fourth dielectric layer.

* * * * *